(12) United States Patent
Iwata et al.

(10) Patent No.: US 11,207,888 B2
(45) Date of Patent: Dec. 28, 2021

(54) LIQUID DISCHARGE HEAD INCLUDING SUPPLY AND DISCHARGE CHANNELS, LIQUID DISCHARGE DEVICE, AND LIQUID DISCHARGE APPARATUS

(71) Applicant: RICOH COMPANY, LTD., Tokyo (JP)

(72) Inventors: Junichi Iwata, Ibaraki (JP); Takahiro Yoshida, Ibaraki (JP); Yukio Otome, Ibaraki (JP); Tomoaki Murakami, Ibaraki (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/934,581

(22) Filed: Jul. 21, 2020

(65) Prior Publication Data
US 2020/0346457 A1    Nov. 5, 2020

Related U.S. Application Data

(63) Continuation of application No. 15/894,996, filed on Feb. 13, 2018, now Pat. No. 10,759,165.

(30) Foreign Application Priority Data

Mar. 21, 2017 (JP) .................................. 2017-054835

(51) Int. Cl.
*B41J 2/14* (2006.01)
*B41J 2/045* (2006.01)
(Continued)

(52) U.S. Cl.
CPC ....... *B41J 2/14201* (2013.01); *B41J 2/04541* (2013.01); *B41J 2/04581* (2013.01); *B41J 2/14274* (2013.01); *B41J 2/15* (2013.01); *B41J 2/1618* (2013.01); *B41J 2/1623* (2013.01); *B41J 2/1632* (2013.01); *B41J 2002/14403* (2013.01);
(Continued)

(58) Field of Classification Search
None
See application file for complete search history.

(56) References Cited

U.S. PATENT DOCUMENTS

| 5,406,318 A | 4/1995 | Moore |
| 5,748,214 A | 5/1998 | Usui |

(Continued)

FOREIGN PATENT DOCUMENTS

| JP | 11-129501 A | 5/1999 |
| JP | 2008-254198 A | 10/2008 |

(Continued)

OTHER PUBLICATIONS

Japanese Office Action dated Feb. 2, 2021 in Japanese Patent Application No. 2017-054835, 3 pages.

*Primary Examiner* — Erica S Lin
(74) *Attorney, Agent, or Firm* — Xsensus LLP

(57) ABSTRACT

A liquid discharge head includes a nozzle to discharge a liquid, an individual chamber communicating with the nozzle, a supply channel communicating with the individual chamber to supply the liquid to the individual chamber, and a discharge channel communicating with the individual chamber to discharge the liquid in the individual chamber. A fluid resistance of the supply channel is greater than a fluid resistance of the discharge channel.

21 Claims, 16 Drawing Sheets

(51) Int. Cl.
*B41J 2/15* (2006.01)
*H01L 41/338* (2013.01)
*B41J 2/16* (2006.01)
*H01L 41/09* (2006.01)
*H01L 41/312* (2013.01)

(52) U.S. Cl.
CPC ........ *B41J 2202/12* (2013.01); *B41J 2202/20* (2013.01); *B41J 2202/21* (2013.01); *H01L 41/0973* (2013.01); *H01L 41/312* (2013.01); *H01L 41/338* (2013.01)

(56) References Cited

U.S. PATENT DOCUMENTS

| | | |
|---|---|---|
| 2003/0202073 A1 | 10/2003 | Dowell |
| 2007/0229608 A1 | 10/2007 | Steiner |
| 2008/0238980 A1 | 10/2008 | Nagashima et al. |
| 2008/0273063 A1 | 11/2008 | Wouters |
| 2009/0290002 A1 | 11/2009 | Katoh |
| 2011/0151578 A1* | 6/2011 | Abate .............. B01L 3/502784 436/180 |
| 2011/0169897 A1 | 7/2011 | Yokoyama |
| 2012/0062659 A1 | 3/2012 | Tsubaki |
| 2013/0057622 A1 | 3/2013 | Govyadinov |
| 2013/0070025 A1* | 3/2013 | Kuwata ................ B41J 2/14274 347/47 |
| 2013/0208059 A1* | 8/2013 | Arimoto .............. B41J 2/14233 347/85 |
| 2016/0297193 A1 | 10/2016 | Yoshida |
| 2017/0087865 A1 | 3/2017 | Yoshida et al. |
| 2017/0096015 A1 | 4/2017 | Odaka et al. |
| 2017/0120602 A1 | 5/2017 | Nakai et al. |
| 2017/0157924 A1 | 6/2017 | Otome et al. |
| 2017/0232741 A1 | 8/2017 | Kikuchi et al. |
| 2017/0239949 A1 | 8/2017 | Yoshida |
| 2017/0253062 A1 | 9/2017 | Murakami et al. |
| 2017/0297333 A1 | 10/2017 | Kohda et al. |

FOREIGN PATENT DOCUMENTS

| | | |
|---|---|---|
| JP | 2013-166260 A | 8/2013 |
| JP | 2016-153240 | 8/2016 |

* cited by examiner

FIG. 4

| RESISTANCE RATIO (Rout/Rin) | SUPPLY-SIDE FLUID RESISTANCE Rin | DISCHARGE-SIDE FLUID RESISTANCE Rout | SUPPLY-SIDE AND DISCHARGE-SIDE FLUID RESISTANCE Rin + Rout | LOWER LIMIT FLOW RATE $\Delta$Qout [mL/min] | Vinm [kPa] | Voutm [kPa] |
|---|---|---|---|---|---|---|
| 0.1 | 3.7E+10 | 3.7E+09 | 4.1E+10 | 22.7 | 13.5 | -1.9 |
| 0.2 | 3.7E+10 | 7.4E+09 | 4.4E+10 | 20.8 | 12.3 | -3.0 |
| 0.3 | 3.7E+10 | 1.1E+10 | 4.8E+10 | 19.2 | 11.3 | -4.0 |
| 0.4 | 3.7E+10 | 1.5E+10 | 5.2E+10 | 17.9 | 10.5 | -4.9 |
| 0.5 | 3.7E+10 | 1.8E+10 | 5.5E+10 | 16.7 | 9.7 | -5.6 |
| 0.6 | 3.7E+10 | 2.2E+10 | 5.9E+10 | 15.6 | 9.1 | -6.3 |
| 0.7 | 3.7E+10 | 2.6E+10 | 6.3E+10 | 14.7 | 8.5 | -6.8 |
| 0.8 | 3.7E+10 | 2.9E+10 | 6.6E+10 | 13.9 | 8.0 | -7.3 |
| 0.9 | 3.7E+10 | 3.3E+10 | 7.0E+10 | 13.2 | 7.6 | -7.8 |
| 1.0 | 3.7E+10 | 3.7E+10 | 7.4E+10 | 12.5 | 7.2 | -8.2 |
| 1.1 | 3.7E+10 | 4.1E+10 | 7.7E+10 | 11.9 | 6.8 | -8.5 |
| 1.2 | 3.7E+10 | 4.4E+10 | 8.1E+10 | 11.4 | 6.5 | -8.9 |

FIG. 5

| RESISTANCE RATIO (Rout/Rin) | SUPPLY-SIDE FLUID RESISTANCE Rin | DISCHARGE-SIDE FLUID RESISTANCE Rout | SUPPLY-SIDE AND DISCHARGE-SIDE FLUID RESISTANCE Rin + Rout | LOWER LIMIT FLOW RATE $\Delta$Qout [mL/min] | Vinm [kPa] | Voutm [kPa] |
|---|---|---|---|---|---|---|
| 0.1 | 6.7E+10 | 6.7E+09 | 7.4E+10 | 22.7 | 24.9 | -3.0 |
| 0.2 | 6.1E+10 | 1.2E+10 | 7.4E+10 | 20.8 | 20.8 | -4.8 |
| 0.3 | 5.7E+10 | 1.7E+10 | 7.4E+10 | 19.2 | 17.7 | -5.9 |
| 0.4 | 5.3E+10 | 2.1E+10 | 7.4E+10 | 17.9 | 15.2 | -6.8 |
| 0.5 | 4.9E+10 | 2.5E+10 | 7.4E+10 | 16.7 | 13.2 | -7.3 |
| 0.6 | 4.6E+10 | 2.8E+10 | 7.4E+10 | 15.6 | 11.5 | -7.7 |
| 0.7 | 4.3E+10 | 3.0E+10 | 7.4E+10 | 14.7 | 10.1 | -7.9 |
| 0.8 | 4.1E+10 | 3.3E+10 | 7.4E+10 | 13.9 | 9.0 | -8.1 |
| 0.9 | 3.9E+10 | 3.5E+10 | 7.4E+10 | 13.2 | 8.0 | -8.1 |
| 1.0 | 3.7E+10 | 3.7E+10 | 7.4E+10 | 12.5 | 7.2 | -8.2 |
| 1.1 | 3.5E+10 | 3.9E+10 | 7.4E+10 | 11.9 | 6.5 | -8.1 |
| 1.2 | 3.3E+10 | 4.0E+10 | 7.4E+10 | 11.4 | 5.9 | -8.1 |

LIQUID DISCHARGE HEAD INCLUDING SUPPLY AND DISCHARGE CHANNELS, LIQUID DISCHARGE DEVICE, AND LIQUID DISCHARGE APPARATUS

CROSS-REFERENCE TO RELATED APPLICATION

This patent application is a continuation application of U.S. application Ser. No. 15/894,996, filed Feb. 13, 2018, which is based on and claims priority pursuant to 35 U.S.C. § 119(a) to Japanese Patent Application No. 2017-054835, filed on Mar. 21, 2017 in the Japan Patent Office, the entire disclosure of which is hereby incorporated by reference herein.

BACKGROUND

Technical Field

Aspects of the present disclosure relate to a liquid discharge head, a liquid discharge device, and a liquid discharge apparatus.

Related Art

As a liquid discharge head to discharge liquid, a circulation-type head is known in which a liquid supplied to an individual chamber and not discharged from a nozzle is returned and circulated from a discharge channel to a discharge-side common chamber to enhance the ability to expel bubbles in the individual chambers to maintain consistent liquid characteristics.

SUMMARY

In one aspect of this disclosure, a novel liquid discharge head includes a nozzle to discharge a liquid, an individual chamber communicating with the nozzle, a supply channel communicating with the individual chamber to supply the liquid to the individual chamber, and a discharge channel communicating with the individual chamber to discharge the liquid in the individual chamber. A fluid resistance of the supply channel is greater than a fluid resistance of the discharge channel.

In another aspect of this disclosure, a novel liquid discharge device includes the liquid discharge head as described above.

In still another aspect of this disclosure, a novel liquid discharge apparatus includes a liquid discharge device as described above.

In still another aspect of this disclosure, a novel liquid discharge head includes a nozzle to discharge a liquid, an individual chamber communicating with the nozzle, a supply channel communicating with the individual chamber to supply the liquid to the individual chamber, a discharge channel communicating with the individual chamber to discharge the liquid in the individual chamber, a supply-side common chamber communicating with the supply channel, a discharge-side common chamber communicating with the discharge channel, a supply port to supply the liquid to the supply-side common chamber, and a discharge port to discharge the liquid outside the liquid discharge head from the discharge-side common chamber. A fluid resistance from the supply port to the nozzles is greater than a fluid resistance from an entrance of the discharge channel to the discharge port via the discharge-side common chamber.

BRIEF DESCRIPTION OF THE DRAWINGS

The aforementioned and other aspects, features, and advantages of the present disclosure will be better understood by reference to the following detailed description when considered in connection with the accompanying drawings, wherein:

FIG. 4 is a table of a supply-side lower limit pressure Vinm and a discharge-side lower limit pressure Voutm in a method A;

FIG. 5 is a table of the supply-side lower limit pressure Vinm and the discharge-side lower limit pressure Voutm in a method B:

Figure 1:
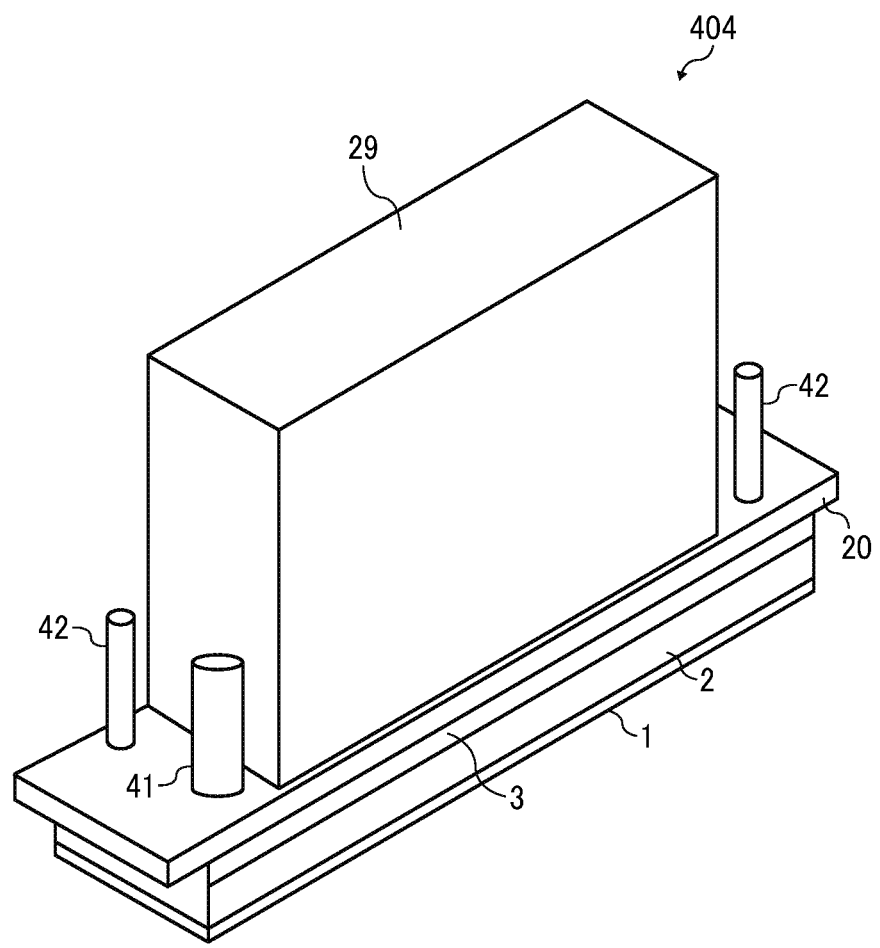
FIG. 1 is a perspective view of a liquid discharge head according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable. As used herein, the singular forms "a", "an", and "the" are intended to include the plural forms as well, unless the context clearly indicates otherwise.

Hereinafter, embodiments of the present disclosure are described with reference to the attached drawings.

Hereinafter, embodiments of the present disclosure are described with reference to the attached drawings.

Figure 2:
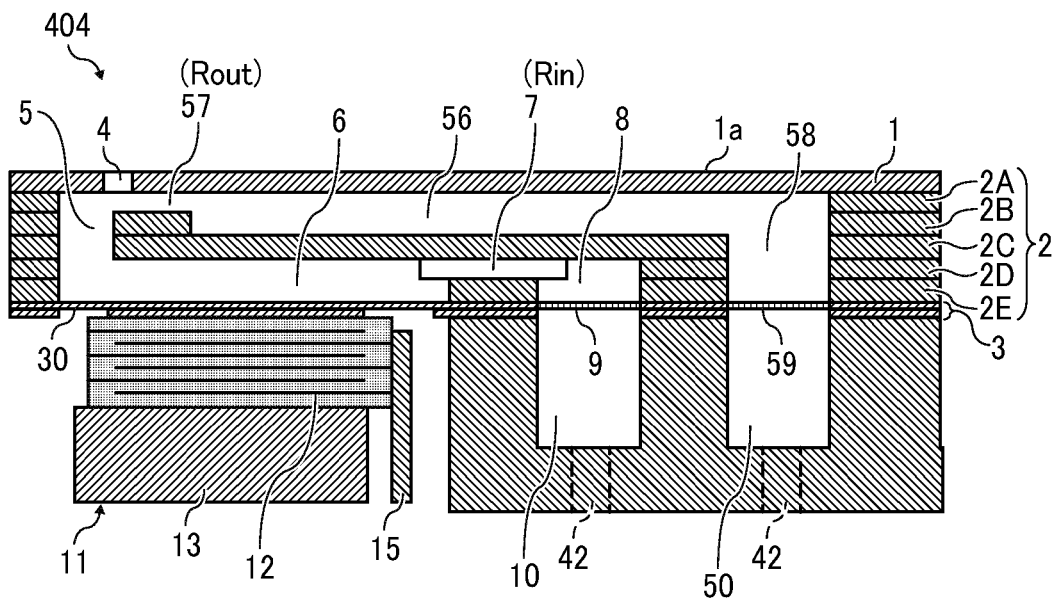
FIG. 2 is a cross-sectional view of the liquid discharge head in a direction perpendicular to a nozzle array direction (NAD) in which nozzles are arrayed in rows

FIGS. 1 and 2 illustrate a liquid discharge head 404 according to a first embodiment of the present disclosure. Hereinafter, a "liquid discharge head" is simply referred to as a "head".

FIG. 1 is an outer perspective view of the head 404.

FIG. 2 is a cross-sectional view of the head 404 in a direction perpendicular to a nozzle array direction (NAD) in which nozzles are arrayed in rows.

The head 404 includes a nozzle plate 1, a channel substrate 2, and a diaphragm 3 serving as a wall. The nozzle plate 1, the channel substrate 2, and the diaphragm 3 are laminated one on another and bonded to each other.

The head 404 includes piezoelectric actuators 11 to displace a vibration portion (vibration plate) 30 of the diaphragm 3, a common chamber substrate 20 as a frame member of the head 404, and a cover 29.

Figure 30:
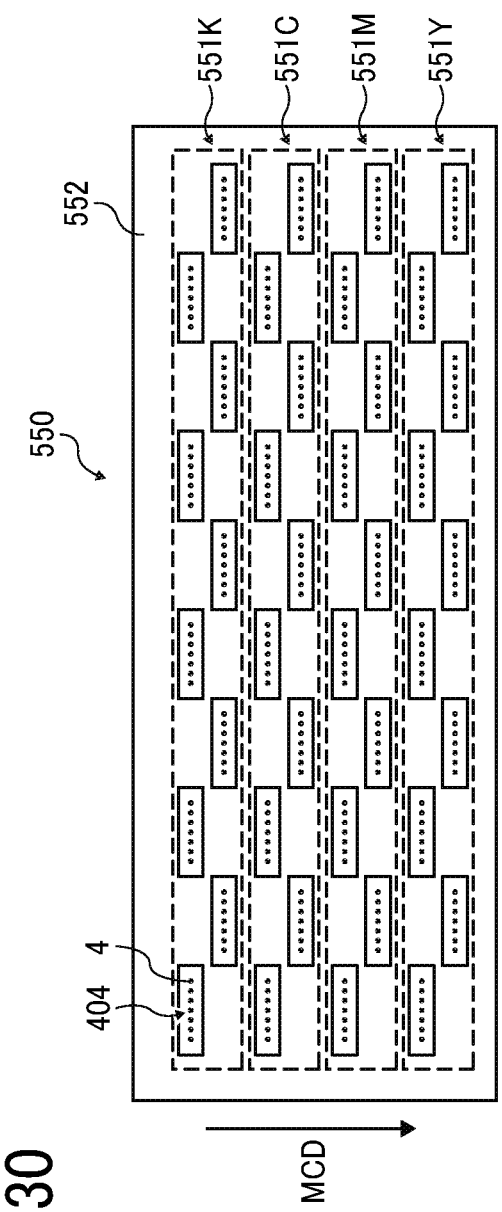
FIG. 30 is a plan view of a head unit of the liquid discharge apparatus of FIG. 29.

The nozzle plate 1 includes multiple nozzles 4 that are holes to discharge liquid (See FIGS. 2 and 30). The nozzles 4 are formed in the nozzle surface 1a of the nozzle plate 1.

As illustrated in FIG. 2, the channel substrate 2 includes individual chambers 6, supply-side fluid restrictors 7, and supply-side liquid introduction portions 8. The individual chambers 6 communicate with the nozzles 4 via nozzle communication channels 5. The supply-side fluid restrictors 7 communicate with the individual chambers 6. The supply-side liquid introduction portions 8 communicate with the supply-side fluid restrictors 7.

In the present embodiment, the channel substrate 2 includes five plate members of 2A, 2B, 2C, 2D, and 2E laminated one on another.

The supply-side fluid restrictor 7 and the supply-side introduction portion 8 constitute a supply channel.

The diaphragm 3 includes deformable vibration portions 30 constituting a wall of the individual chambers 6 of the channel substrate 2.

In the present embodiment, the diaphragm 3 has a two-layer structure including a first layer and a second layer. The first layer forms thin portions from the channel substrate 2. The second layer forms thick portions. The first layer includes the deformable vibration portions 30 at positions corresponding to the individual chambers 6. Note that the diaphragm 3 is not limited to the two-layer structure and the number of layers may be any other suitable number.

The piezoelectric actuator 11 is disposed on the opposite side of the individual chamber 6 of the diaphragm 3. The piezoelectric actuator 11 includes an electromechanical transducer element as a driver (e.g., actuator, pressure generator) to deform the vibration portions 30 of the diaphragm 3.

The piezoelectric actuator 11 includes piezoelectric elements 12 bonded on a base 13. The piezoelectric elements 12 are groove-processed by half cut dicing so that each piezoelectric elements 12 includes a desired number of pillar-shaped piezoelectric elements 12 that are arranged in certain intervals to have a comb shape.

The piezoelectric element 12 is joined to the vibration portions (vibration plate) 30 of the diaphragm 3.

In addition, a flexible printed circuit (FPC) 15 is connected to the piezoelectric elements 12.

The common chamber substrate 20 includes a supply-side common chamber 10 and a discharge-side common chamber 50.

The supply-side common chamber 10 is communicated with supply ports 41 (See FIG. 1). The discharge-side common chamber 50 is communicated with the discharge ports 42 (See FIGS. 1 and 2). The supply ports supplies the liquid into the head 404 from the outside the head 404. The discharge ports 42 discharge the liquid from the head 404 to outside the head 404.

The supply-side common chamber 10 is communicated with the supply-side liquid introduction portions 8 via a filter 9. The filter 9 is formed by a first layer of the diaphragm 3.

The channel substrate 2 includes a discharge-side fluid restrictor 57, a discharge-side individual channel 56, and a discharge-side introduction portion 58 that communicate with each individual chamber 6 via the nozzle communication channel 5.

The discharge-side introduction portions 58 communicate with the discharge-side common chamber 50 via a filter 59.

The filter 59 is formed by a first layer of the diaphragm 3.

In the present embodiment, a supply channel is constituted by the filter 9, the supply-side introduction portion 8, and the supply-side fluid restrictor 7.

A discharge channel is constituted by the discharge-side fluid restrictor 57, the discharge-side individual channel 56, the discharge-side introduction portion 58, and the filter 59. Each of the plurality of supply channels has a supply-side fluid restrictor 7, and each of the plurality of discharge channels has a discharge-side fluid restrictor 57.

In the head 404 thus configured, for example, when a voltage lower than a reference potential (intermediate potential) is applied to the piezoelectric element 12, the piezoelectric element 12 contracts. Accordingly, the vibration portion 30 of the diaphragm 3 is pulled to increase the volume of the individual chamber 6, thus causing liquid to flow into the individual chamber 6.

When the voltage applied to the piezoelectric element 12 is raised, the piezoelectric element 12 extends in a direction of lamination. Accordingly, the vibration portion 30 of the diaphragm 3 deforms in a direction toward the nozzle 4 and the volume of the individual chamber 6 decreases. Thus, liquid in the individual chamber 6 is pressurized and discharged from the nozzle 4.

Liquid not discharged from the nozzles 4 passes the nozzles 4, and is discharged from the discharge-side fluid restrictor 57 to the discharge-side common chamber 50 via the discharge-side individual channel 56, the discharge-side introduction portion 58, and the filter 59.

The liquid is supplied from the discharge-side common chamber 50 to the supply-side common chamber 10 again through an external circulation path.

Even when the liquid is not discharged from the nozzles 4, the liquid flows from the supply-side common chamber 10 to the discharge-side common chamber 50 via the individual chamber 6. Then, the liquid is supplied to the supply-side common chamber 10 again through the external circulation path.

Note that the driving method of the head 404 is not limited to the above-described example (pull-push discharge). For example, pull discharge or push discharge may be performed in response to the way to apply the drive waveform.

Next, an equivalent circuit of an individual chamber circulation-type head is described with reference to FIG. 3. The individual chamber circulation-type head is one that circulates the liquid in the individual chamber 6.

Figure 3:
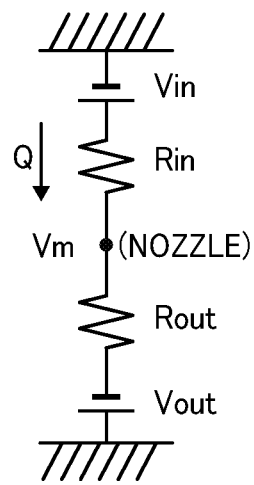
FIG. 3 is an electrical equivalent circuit of an individual chamber circulation-type head.

FIG. 3 is an equivalent circuit from the supply ports 41 to the discharge port 42.

When positive pressure is applied to the supply-side common chamber 10 of the head 404 and negative pressure is applied to the discharge-side common chamber 50, a liquid flow that flows from the supply-side common chamber 10 toward the discharge-side common chamber 50 via the supply-side introduction portion 8, the supply-side the supply-side fluid restrictor 7, the individual chamber 6, the nozzle communication channel 5, the nozzles 4, the discharge-side fluid restrictor 57, the discharge-side individual channel 56, and the discharge-side introduction portion 58.

The liquid is again supplied to the supply-side common chamber 10 via an external circulation path.

Here, as also illustrated in FIG. 4, a flow rate of a circulated liquid (circulated flow rate) Q [m³/sec] and a meniscus pressure Vm [Pa] in the nozzles 4 are obtained by the following Equations 1, where Vin [Pa] represents a supply-side pressure of the liquid to be supplied to the supply-side common chamber 10, Vout[Pa] represents a discharge-side pressure of the liquid to be supplied to the discharge-side common chamber 50, Rin [Pa·sec/m³] represents a fluid resistance of a supply-side channel (supply-side fluid resistance), and Rout [Pa sec/m³] represents a fluid resistance of the discharge-side channel.

Here, the "supply-side channel" refers to a channel individually formed corresponding to the nozzle 4 between the supply-side common chamber 10 and the individual chamber 6.

The supply-side channel corresponds to a part of the supply-side introduction portion 8 (an individually formed portion) and the supply-side fluid restrictor 7.

Here, the "discharge-side channel" refers to a channel individually formed corresponding to the nozzle 4 between the nozzle 4 and the discharge-side common chamber 50.

The discharge-side channel corresponds to the discharge-side fluid restrictor 57, the discharge-side individual channel 56, and a part of the discharge-side introduction portion 58 (an individually formed portion).

$$Q=(Vin-Vout)/(Rin+Rout) \qquad \text{[Equation 1]}$$

$$Vm=(Vin \times Rout + Vout \times Rin)/(Rin+Rout) \qquad \text{[Equation 2]}$$

That is, the flow rate of a circulated liquid Q [m³/sec] and the meniscus pressure Vm [Pa] in the nozzles 4 are determined by the supply-side pressure loss depending on the supply-side pressure Vin and the supply-side fluid resistance Rin, and the circulation-side pressure loss depending on the discharge-side pressure Vout and the discharge-side fluid resistance Rout.

Therefore, the discharge-side pressure loss decreases than the supply-side pressure loss by lowering the circulation-side fluid resistance Rout with respect to the supply-side fluid resistance Rin. In other words, a fluid resistance Rin from the supply port 41 to the nozzle 4 is greater than a fluid resistance Rout from an entrance of the discharge-side fluid restrictor 57 to the discharge port 42 (Rin>Rout). Thus, a loss of the discharge-side pressure Vout transmitted to the meniscus in the nozzles 4 decreases.

The circulation flow rate is determined by the pressure difference between the supply-side pressure Vin and the discharge-side pressure Vout.

An absolute value of the discharge-side pressure Vout can be reduced while keeping the circulation flow rate constant by increasing the supply-side pressure Vin by an amount corresponding to a decrease of the absolute value of the discharge-side pressure Vout.

Therefore, the present embodiment can lower the lower limit of the absolute value of the discharge-side pressure Vout. That is, the negative pressure of the discharge-side pressure Vout is reduced.

In addition, a channel resistance of (Rin+Rout) has a dominant influence on the magnitude of the channel resistance of the entire head 404. Thus, the channel resistance of the entire head 404 is lowered by lowering the discharge-side fluid resistance Rout.

When the liquid flows at the same flow rate, the higher the liquid viscosity is, the higher the pressure loss (fluid resistance) becomes. Thus, a large differential pressure is required for generating the circulation flow.

Therefore, the differential pressure can be reduced by lowering the fluid viscosity (pressure loss) of the entire head 404 when comparing the liquid of the same viscosity.

Accordingly, the present embodiment can allow an increase in the pressure loss caused by an increase in the viscosity of the liquid.

In the circulation type head having the individual chamber 6, an amount of change in a supply-side flow rate ΔQin and an amount of change in a discharge-side flow rate ΔQout is expressed by the following equations. Here, Qn represents a discharge amount of the liquid. Rk:Rh represents a ratio between the supply-side resistance Rk and the discharge-side resistance Rh.

$$\Delta Qin = Qn \times Rh(Rk+Rh) \quad \text{[Equation 3]}$$

$$\Delta Qout = -Qn \times Rk/(Rk+Rh) \quad \text{[Equation 4]}$$

At this time, the flow rate Q of the liquid circulated in the head 404 is preferably greater than an amount of change in the flow rate ΔQn during a discharge operation.

In addition, the lower limit flow rate Qlow required to prevent reverse flow at the time of the discharge operation (lower limit circulation flow rate) is expressed by Qlow=ΔQout. The reverse flow is the liquid flow from the discharge-side fluid restrictor 57 to the nozzle 4.

A lower limit pressure difference Plow is obtained from a pressure difference derived from this lower limit flow rate Qlow (ΔQout) and Equation 1.

The supply-side lower limit pressure Vinm and the discharge-side lower limit pressure Vout are obtained from the supply-side pressure Vin and the discharge-side pressure Vout, respectively. The supply-side pressure Vin and the discharge-side pressure Vout are derived from the lower limit pressure difference Plow and Equation 2.

From Equation 4, the smaller the discharge-side resistance Rh becomes with respect to the supply-side resistance Rk, the greater the lower limit flow rate Qlow (ΔQout) becomes.

From Equation 1, the smaller the fluid resistance is, the lower the lower limit pressure difference Plow becomes.

When the discharge-side fluid resistance Rout is decreased, the increase in the amount of change in the discharge-side flow rate ΔQout and the decrease in the amount of change in the discharge-side fluid resistance Rout cancel each other out.

Thus, the discharge-side lower limit pressure Voutm derived from Equation 2 decreases while the lower limit pressure difference Plow derived from Equation 1 remains constant.

The negative pressure to be applied to the discharge-side common chamber 50 can be reduced by decreasing the discharge-side lower limit pressure Voutm.

Thus, a liquid circulation process can be performed while preventing an alteration of the liquid quality due to the negative pressure, even if the liquid has a property of changing its quality by negative pressure.

Next, the supply-side fluid resistance Rin and the discharge-side fluid resistance Rout in the present embodiment is described.

Here, the supply-side fluid resistance Rin and the discharge-side fluid resistance Rout are set so that a resistance ratio becomes Rout/Rin=0.8.

The meniscus pressure Vm is set in a range of 0 to −300 mmAq, and a target meniscus pressure Vm is set to Vm=−50 mmAq.

It is assumed that the fluid resistance of entire head 404 is 6.63E+10 when the liquid viscosity is 6 cP and the flow rate required for preventing the back flow (lower limit circulation flow rate) Qlow=13.89 mL/min. Then, the lower limit pressure difference is 15.35 kPa, the discharge-side lower limit pressure Voutm is −7.3 kPa, and the supply-side lower limit pressure Vinm is 8.0 kPa.

On the other hand, when the resistance ratio Rout/Rin is set Rout/Rin=1.0 (Comparative Example), the lower limit pressure difference Plow is 15.35 kPa, the discharge-side lower limit pressure Voutm is −8.16 kPa, and the supply-side lower limit pressure Vinm is 7.18 kPa when the lower limit flow rate Qlow required for preventing the reverse flow (lower limit circulation flow rate) Qlow=12.5 mL/min and the fluid resistance of entire head 404 is 7.37E+10 when the liquid viscosity is 6 cP.

These results are illustrated in Table 1.

TABLE 1

| | COMPARATIVE EXAMPLE | PRESENT EMBODIMENT |
|---|---|---|
| FLUID RESISTANCE OF ENTIRE HEAD | 7.37E+10 | 6.63E+10 |
| DISCHARGE-SIDE LOWER LIMIT PRESSURE Voutm | −8.16 kPa | −7.3 kPa |
| SUPPLY-SIDE LOWER LIMIT PRESSURE Vinm | 7.18 kPa | −8.0 kPa |

Next, following describes an effect of making the discharge-side fluid resistance Rout smaller than the supply-side fluid resistance Rin, and a preferable range of the fluid resistance ratio (Rout/Rin).

As described above, the circulation flow rate Q during circulation process is determined by Equation 1 as described above.

Further, the lower limit of the flow rate Qlow required for preventing the back flow is obtained by the above-described Equation 4 when the fluid resistance of the channel is determined. As described above, Equation 4 is used for obtaining the amount of change in the discharge-side flow rate ΔQout of when Qn represents the discharge amount of the liquid.

The lower limit pressure difference Plow is obtained from these Equations 1 and 4. Specific values of the supply-side pressure Vin and the discharge-side pressure Vout are derived from the following Equation 5. Equation 5 is same as Equation 2 as described above. Equation 5 is used for obtaining the meniscus pressure Vm of the nozzles 4.

$$Vm = (Vin \times Rout + Vout \times Rin)/(Rin+Rout) \quad \text{[Equation 5]}$$

That is, the values of the supply-side pressure Vin and the discharge-side pressure Vout are determined by the ratio of the supply-side fluid resistance Rin and the discharge-side fluid resistance Rout (resistance ratio Rout/Rin).

Here, as a method of changing the ratio of fluid resistance Rout/Rin, there are following methods A and B.

Method A: either one of the supply-side fluid resistance Rin or the discharge-side fluid resistance Rout is fixed. Then, the resistance ratio (Rout/Rin) is changed.

Method B: the resistance ratio (Rout/Rin) is changed while a total resistance R=Rin+Rout is fixed.

In this case, in Method A, the total resistance decreases when one of the supply-side fluid resistance Rin and the discharge-side fluid resistance Rout is reduced.

Thus. Method A can increase the effect of reducing the pressure difference.

Here, the target meniscus pressure Vm=−50 mmAq and an experimental value of the discharge amount Qn is 25 mL/min, and the resistance Rin and Rout are Rin=Rout=3.7E+10 when the resistance ratio between Rin and Rout is Rin:Rout=1:1 (Rout/Rin=1.0).

Then, the supply-side pressure Vin and the discharge-side pressure Vout when the resistance ratio Rout/Rin was varied from 0.1 to 1.2 are calculated from Equations 1, 4, and 5.

In the method A, the supply-side lower limit pressure Vinm and the discharge-side lower limit pressure Voutm when the supply-side fluid resistance Rin is fixed and the discharge-side fluid resistance Rout is varied are illustrated in FIG. 4.

Further, FIG. 5 illustrate the supply-side lower limit pressure Vinm and the discharge-side lower limit pressure Voutm in Method B.

Figure 6:
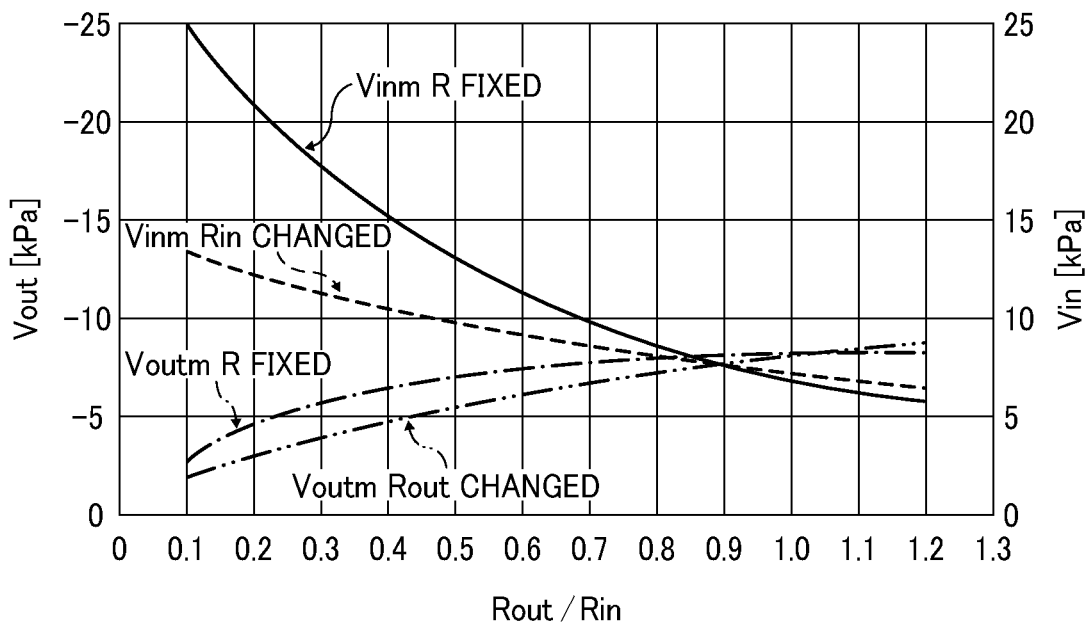
FIG. 6 is a graph that illustrates results of FIGS. 4 and 5.

The results of FIGS. 4 and 5 are illustrated by the graph in FIG. 6.

In FIG. 6, the results of FIG. 4 (method A) are indicated as "Vinm Rin CHANGED", "Voutm Routm CHANGED". The results of FIG. 5 (method B) are indicated as "Vinm R FIXED" and "Voutm R FIXED".

Here, since the absolute values of the supply-side lower limit pressure Vinm and the discharge-side lower limit pressure Voutm become the lowest pressures to enable the circulation process, the absolute values of the supply-side lower limit pressure Vinm and the discharge-side lower limit pressure Voutm are preferably smaller values.

The Method A has a large effect of reducing the pressure difference. As described above, when the method A is used, as illustrated in FIG. 6, the discharge-side lower limit pressure Voutm Rout CHANGED in Method A becomes lower (absolute value becomes greater) than the discharge-side lower limit pressure Voutm R FIXED in Method B when the resistance ratio (Rout/Rin) is greater than one (Rout/Rin>1).

Thus, it is preferable to set the resistance ratio (Rout/Rin) to be equal to or smaller than one (Rout/Rin≤1).

On the other hand, when the discharge-side fluid resistance Rout is fixed by the Method A, it is necessary to change the supply-side fluid resistance Rin (Vinm Rin CHANGED in FIG. 6). However, the supply-side fluid resistance Rin greatly affects the discharge characteristics of the head 404. Thus, there is less room for adjustment.

Here, according to FIG. 6, when the supply-side lower limit pressure Vinm in the Method A becomes lower than the resistance ratio (Rout/Rin) 0.5, the supply-side lower limit pressure Vinm exceeds 10 kPa which is a pressure relatively easy to control.

Therefore, it is preferable to control the resistance ratio (Rout/Rin) within a range from 0.5 to 1.

From Equations 1 and 4, the lower limit pressure difference Plow decreases as the channel resistance decreases, and the lower limit flow rate ΔQout increases with a decrease in the discharge-side fluid resistance Rout with respect to the supply-side fluid resistance Rin.

In the Method A, the decrease in the channel resistance and the increase in the lower limit flow rate cancel each other. Thus, the Method A can increase the effect of decreasing the discharge-side lower limit pressure Voutm derived from Equation 2 while keeping the lower limit pressure difference derived from Equation 1 constant.

Figure 7:
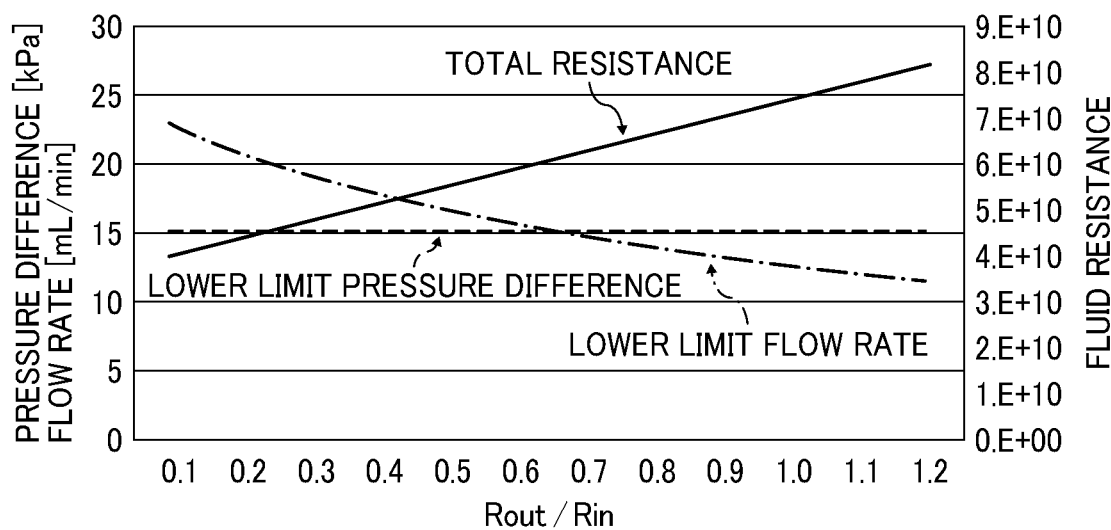
FIG. 7 is a graph that illustrates a lower limit pressure difference, a lower limit flow rate, and a total resistance in the method A.

FIG. 7 illustrates the lower limit pressure difference Plow, the lower limit flow rate Qlow required for preventing the back flow (lower limit circulation flow rate), and the total resistance R when the resistance ratio (Rout/Rin) is from 0.1 to 1.2 in the Method A.

In Method B, since the channel resistance is not changed and the lower limit flow rate Qlow is increased, the lower limit pressure difference Plow derived from Equation 1 increases. Thus, the effect of decreasing the discharge side lower limit pressure Voutm derived from Equation 2 is small.

Figure 8:
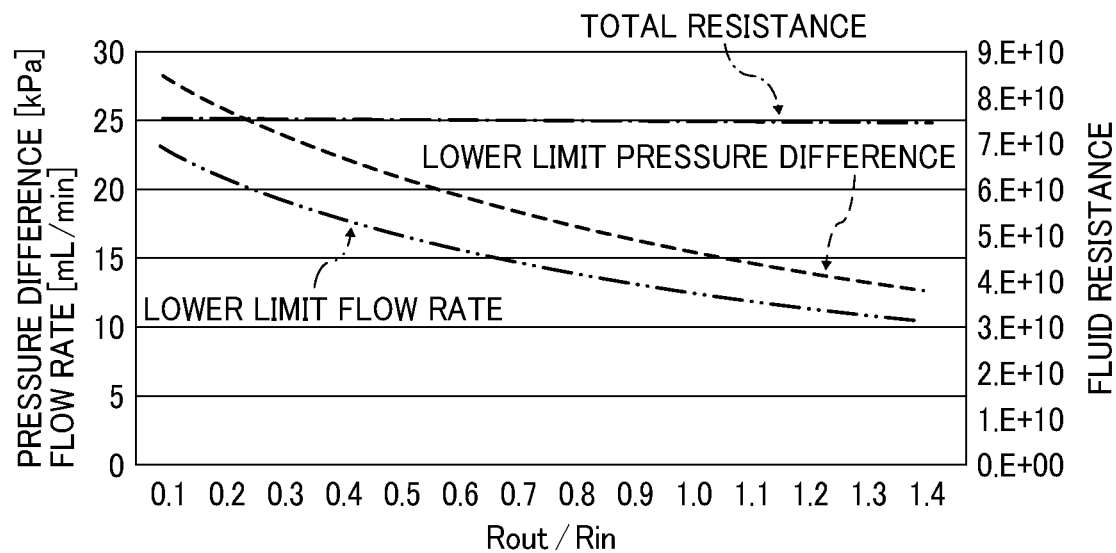
FIG. 8 is a graph that illustrates a lower limit pressure difference, a lower limit flow rate, and a total resistance in the method B.

FIG. 8 illustrates the lower limit pressure difference Plow, the lower limit flow rate Qlow required for preventing the reverse flow (lower limit circulation flow rate), and the total resistance R when the resistance ratio (Rout/Rin) is from 0.1 to 1.2 in the Method B.

Figure 9:
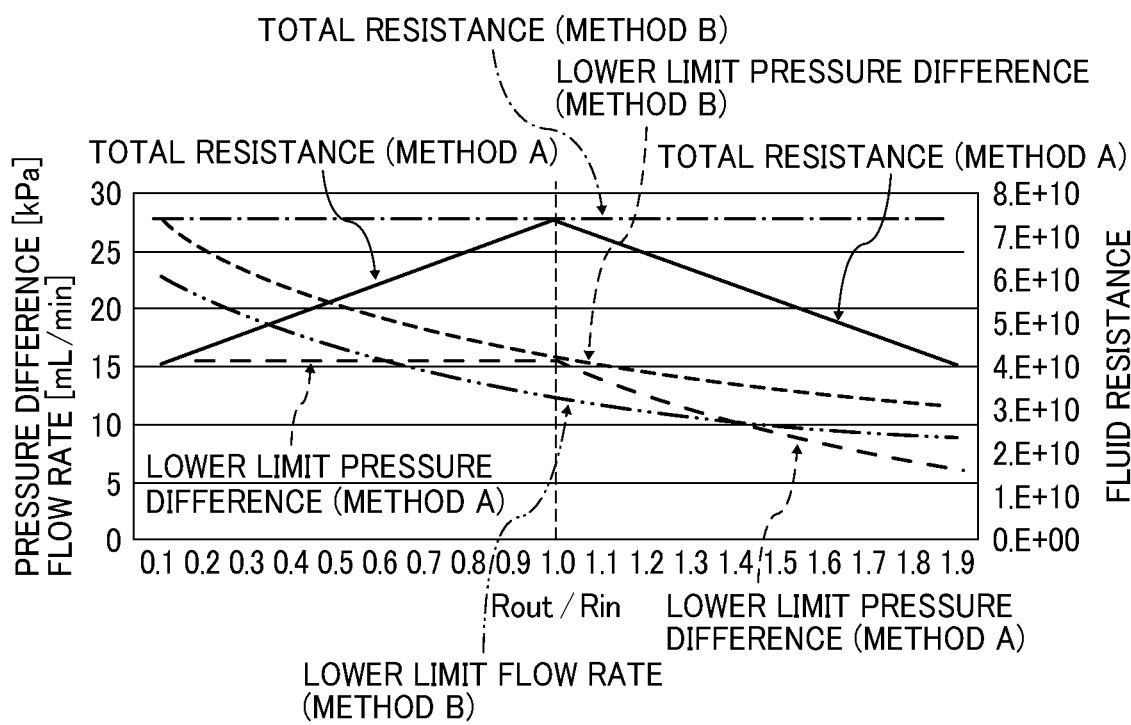
FIG. 9 is a graph that illustrates a lower limit pressure difference, a lower limit flow rate, and a total resistance in another example of the method B.

For reference, FIG. 9 illustrates the lower limit pressure difference Plow, the lower limit flow rate Qlow (lower limit circulation flow rate), and the total resistance R calculated when the resistance ratio Rout/Rin is from 1.9 to 0.1 in Method B.

Further, FIG. 9 illustrates the lower limit pressure difference Plow, the lower limit flow rate Qlow, and the total resistance R calculated when the supply-side fluid resistance Rin is lowered while Rout/Rin=1.9 to 1, and the discharged-side fluid resistance Rout is lowered while Rout/Rin is from 1 to 0.1 in Method A.

Figure 10:
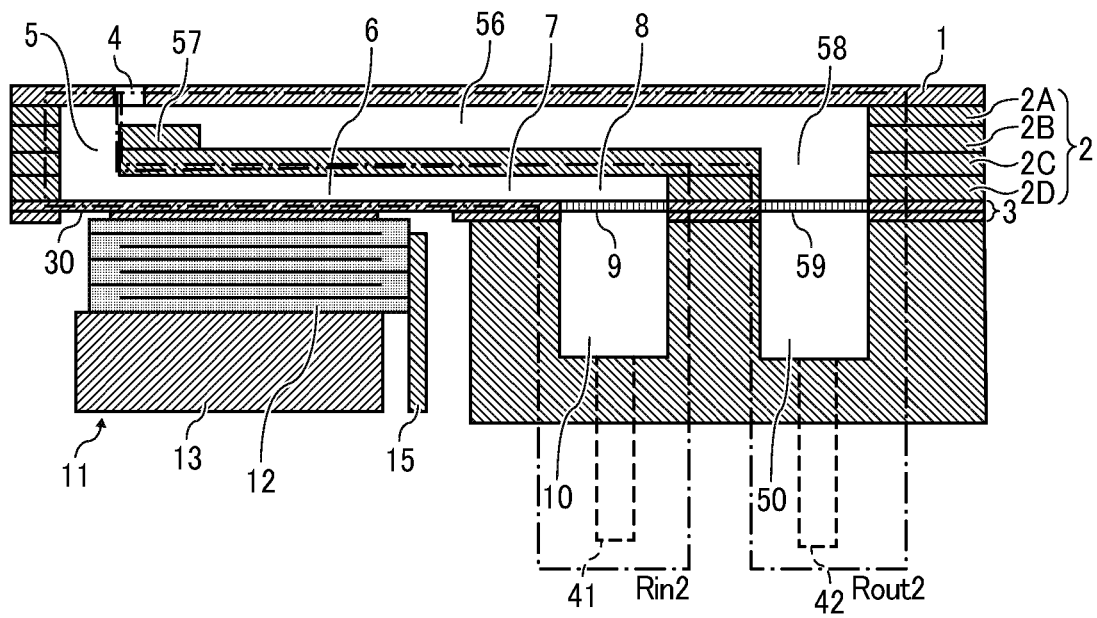
FIG. 10 is a cross-sectional view of the liquid discharge head according to a second embodiment of the present disclosure in the direction perpendicular to the nozzle array direction.

FIG. 10 is a cross-sectional view of the head 404 according to a second embodiment along a direction perpendicular to the nozzle array direction (NAD).

In the present embodiment, the channel substrate 2 includes four plate members 2A through 2D laminated one atop the other.

The supply-side fluid restrictor 7 is formed in the plate member 2D.

Here, Rin2 represents a total fluid resistance of a channel from the supply port 41 to the nozzles 4 via the supply-side common chamber 10, the filter 9, the supply-side introduction portion 8, the supply-side fluid restrictor 7, the individual chamber 6, and the nozzle communication channel 5. The liquid outside the head 404 is supplied to the supply-side common chamber 10 of the head 404 from the supply port 41.

Further, Rout2 represents a total fluid resistance of a channel from an entrance of the discharge-side fluid restrictor 57 to the discharge port 42 via the discharge-side fluid restrictor 57, the discharge-side individual channel 56, the discharge-side introduction portion 58, the filter 59, and the discharge-side common chamber 50. The liquid in the head 404 is discharged outside the head 404 from the discharge-side common chamber 50 through the discharge port 42.

Then, the relation between the fluid resistance Rin2 and the fluid resistance Rout2 is set such that Rin2>Rout2.

That is, the resistance ratio Rout2/Rin2 is set smaller than one (Rout2/Rout1<1). Here, the resistance ratio Rout2/Rin2=0.8.

Thus, the head 404 includes a supply-side common chamber 10 communicating with the plurality of supply channels, a discharge-side common chamber 50 communicating with the plurality of discharge channels, a supply port 41 to supply the liquid to the supply-side common chamber 10, and a discharge port 42 to discharge the liquid outside the head 404 from the discharge-side common chamber 50. A fluid resistance Rin2 from the supply port 41 to the nozzle 4 is greater than a fluid resistance Rout2 from an entrance of the discharge-side fluid restrictor 57 to the discharge port 42.

Thus, the present embodiment can circulate the liquid while ensuring stable liquid characteristics by making the fluid resistance of the entire discharge-side channels smaller than the fluid resistance of the entire supply-side channels as described above, even if the liquid is one that exhibits a change in quality under negative pressure.

A third embodiment according to the present disclosure is described with reference to FIG. 11.

Figure 11:
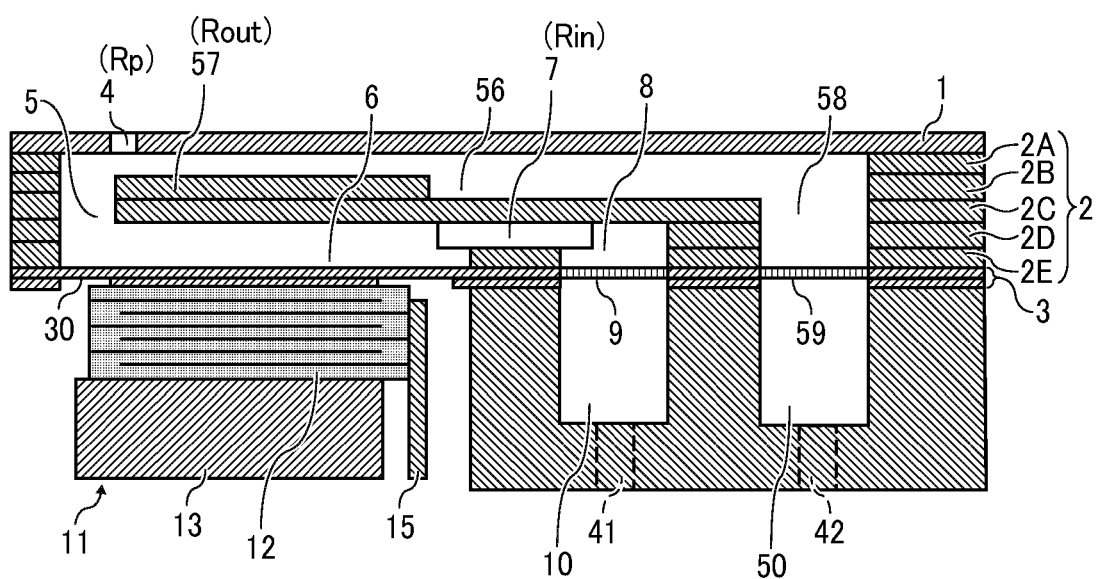
FIG. 11 is a cross-sectional view of the liquid discharge head according to a third embodiment of the present disclosure in the direction perpendicular to the nozzle array direction.

FIG. 11 is a cross-sectional view of the head 404 according to the third embodiment along a direction perpendicular to the nozzle array direction (NAD).

In the present embodiment, the fluid resistance of the nozzle 4 is represented as Rp, and the relation of Rin, Rout, and Rp are set such that Rin>Rout>Rp.

Here, the fluid resistance Rp of the nozzle 4 is about 1/10 of the supply-side fluid resistance Rin and the discharge-side fluid resistance Rout.

In addition, the resistance ratio Rout/Rin is set to 0.5<Rout/Rin<1.

Actual measurement results when the head 404 discharges the maximum discharge amount are illustrated in Table 2.

Table 2 illustrates values when the fluid resistance ratio Rout/Rin is "0.86" (when the fluid resistance reverse ratio Rin/Rout is "1.16").

TABLE 2

| | AMOUNT OF CHANGE IN FLOW RATE [%] | |
| --- | --- | --- |
| | SUPPLY-SIDE | DISCHARGE-SIDE |
| THEORETICAL VALUE | 46.2 | −53.8 |
| ACTUAL MEASUREMENT | 40.2 | −57.9 |

In order to maintain the meniscus even at the maximum discharge amount and to control an amount of change in the supply-side flow rate and in the discharge-side flow rate to be within a range of the resistance ratio, the fluid resistance Rp of the nozzle 4 is suitably about 1/10 of a sum of the supply-side fluid resistance Rin and the discharge-side fluid resistance Rout (Rin+Rout).

It is assumed that a flow rate of the liquid during the liquid is not circulated is represented by i0, a meniscus pressure is represented by Vm, and the negative pressure Vp caused by the discharge operation from the nozzle 4 is applied to the individual chamber 6.

Figure 12A:
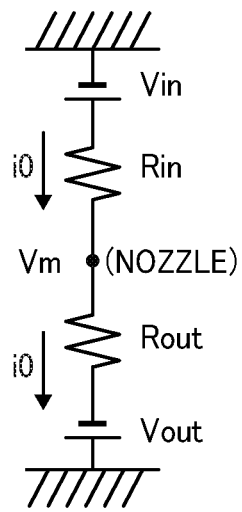
FIGS. 12A and 12B are electrical equivalent circuits of the liquid discharge head during a non-discharge operation and a discharge operation.
Figure 12B:
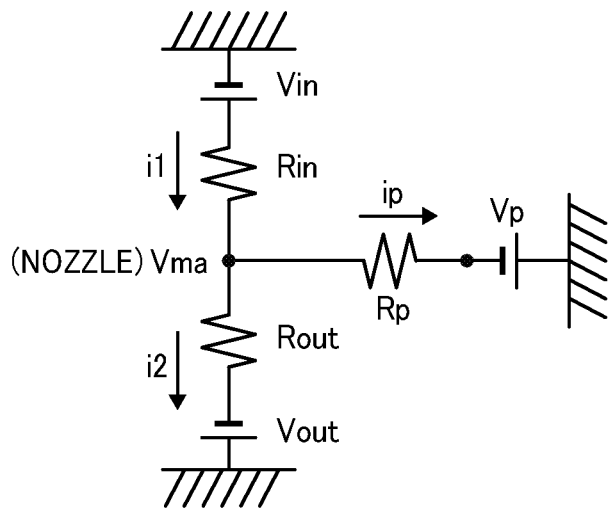

Then, calculation models as illustrated in FIGS. 12A and 12B can be applied. FIG. 12A illustrates a calculation model during a non-discharge operation in which the liquid is not discharged from the nozzles 4. FIG. 12B illustrates a calculation model during a discharge operation in which the liquid is discharged from the nozzles 4.

An amount of the liquid ip discharged from the nozzle 4 is assumed to be constant. Then, when the negative pressure Vp is applied to the nozzle 4, a pressure loss ip×Rp in addition to the negative pressure Vp is applied to the meniscus pressure Vma.

Applying negative pressure to the meniscus pressure Vma increases a supply-side flow rate i1 and decreases a discharge-side flow rate i2 during the discharge operation.

Further, a pressure loss due to supply-side fluid resistance Rin and discharge-side fluid resistance Rout influences the meniscus pressure Vma to cause a pressure fluctuations Vina and Vouta.

At this time, the negative pressure applied to the meniscus pressure Vma is limited by lowering the fluid resistance Rp of the nozzle 4.

Therefore, the amount of increase in the supply-side flow rate i1 and the amount of decrease in the discharge-side flow rate i2 can be limited.

FIG. 8 illustrates the head 404 according to a fourth embodiment of the present disclosure.

Figure 13:
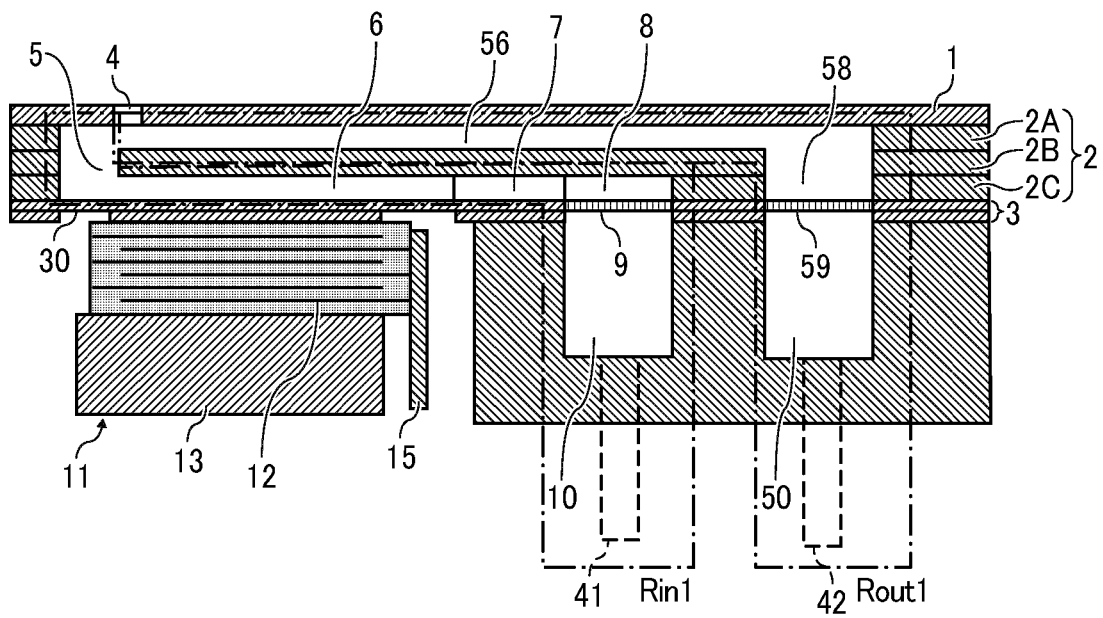
FIG. 13 is a cross-sectional view of the liquid discharge head according to a fourth embodiment of the present disclosure in the direction perpendicular to the nozzle array direction.

FIG. 13 is a cross-sectional view of the head 404 according to the fourth embodiment along a direction perpendicular to the nozzle array direction (NAD).

In the present embodiment, the channel substrate 2 includes four plate members 2A through 2C laminated one atop the other.

The present embodiment illustrated in FIG. 13 does not include a discharge-side fluid restrictor 57 as illustrated in FIGS. 10 and 11. Further, the discharge-side individual channel 56 is directly connected to the individual chamber 6 via the nozzle communication channel 5 without interposing the discharge-side fluid restrictor 57.

Here, Rin1 represents a total fluid resistance of a channel from the supply port 41 to the nozzles 4 via the supply-side common chamber 10, the filter 9, the supply-side introduction portion 8, the supply-side fluid restrictor 7, the individual chamber 6, and the nozzle communication channel 5. The liquid outside the head 404 is supplied to the supply-side common chamber 10 of the head 404 from the supply port 41.

Further, Rout1 represents a total fluid resistance of a channel from an entrance of the discharge-side fluid restrictor 57 to the discharge port 42 via the discharge-side fluid restrictor 57, the discharge-side individual channel 56, the discharge-side introduction portion 58, the filter 59, and the discharge-side common chamber 50. The liquid in the head 404 is discharged outside the head 404 from the discharge-side common chamber 50 through the discharge port 42.

The relation between the fluid resistance Rin1 and the fluid resistance Rout1 is set to Rin1>Rout1.

That is, the resistance ratio Rout1/Rin1 is set smaller than one (Rout1/Rin1<1). Here, the resistance ratio Rout1/Rin1=0.8.

As described above, even the head 404 does not include the discharge-side fluid restrictor 57, the liquid can be circulated by making the fluid resistance in the entire discharge-side channels smaller than the fluid resistance in the entire supply-side channels while preventing the alteration of the liquid quality due to the negative pressure, even if the liquid has a property of changing its quality under negative pressure.

Figure 14:
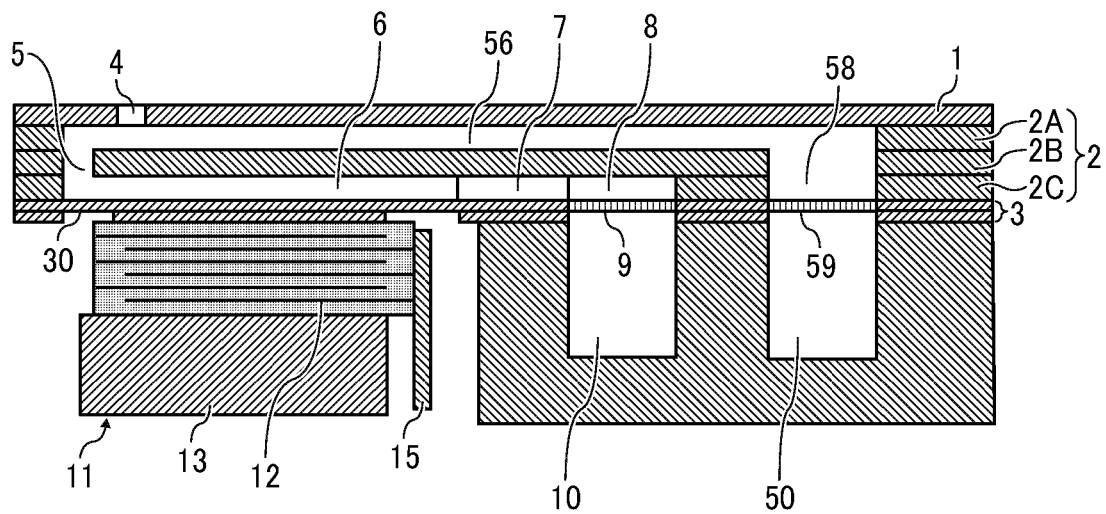
FIG. 14 is a cross-sectional view of the liquid discharge head according to a fifth embodiment of the present disclosure in the direction perpendicular to the nozzle array direction.
Figure 15:
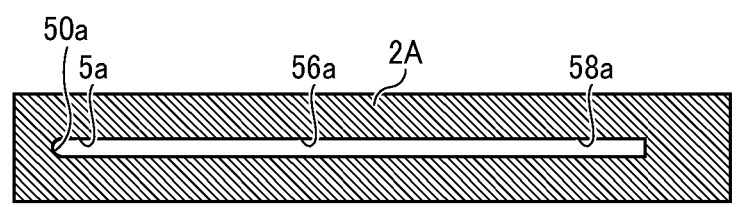
FIG. 15 is a plan view of a plate member that forms a discharge channel.
Figure 16:
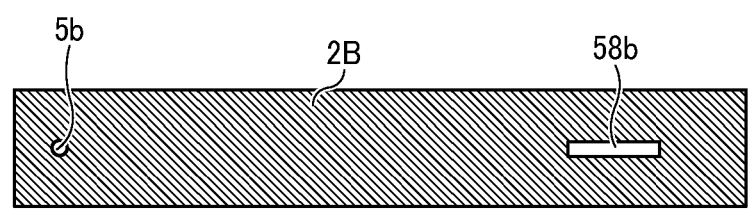
FIG. 16 is a plan view of the plate member that forms a nozzle communication channel.

FIGS. 14 to 16 illustrate the head 404 according to a fifth embodiment of the present disclosure.

FIG. 14 is a cross-sectional view of the head 404 according to the fifth embodiment along a direction perpendicular to the nozzle array direction (NAD).

FIG. 15 is a plan view of a plate member 2A that forms the discharge channels (the discharge-side individual channel 56 and the discharge-side introduction portion 58).

FIG. 16 is a plan view of a plate member 2B that forms the nozzle communication channel 5.

The head configuration of the present embodiment is the same as that of the fourth embodiment, but the head configuration of the first to third embodiments can also be used.

As illustrated in FIG. 15, the plate member 2A that forms the channel substrate 2 includes a through-hole 5a that constitute a part of the nozzle communication channels 5, a through-hole 56a that becomes the discharge-side individual channel 56, and a through-hole 58a that constitute a part of the discharge-side introduction portion 58. The discharge-side individual channel 56 and the discharge-side introduction portion 58 constitute the discharge channels. The through-holes 5a, 56a, and 58a are continuously formed on the plate member 2A.

Here, the wall surface 50a of one end (left side in FIG. 15) of the nozzle communication channel 5 has a curved surface, here, an arc shape in a plan view. The wall surface 50a of the nozzle communication channel 5 faces to an entrance of the discharge-side individual channel 56. The discharge-side individual channel 56 becomes an entrance of the discharge channels.

Thus, the head 404 includes a nozzle communication channel 5 to communicate the individual chamber 6 and the nozzle 4. A wall surface 50a of the nozzle communication channel 5 facing an entrance of the discharge channel has a curved surface.

Further, as illustrated in FIG. 16, a circular through-hole 5b is formed in the plate member 2B that constitutes the channel substrate 2. The circular through-hole 5b forms a remainder of the nozzle communication channel 5.

Further, a through-hole 58b is formed in the plate member 2B that constitutes a part of the discharge-side introduction portion 58. The through-hole 58b is a slot having a rectangular shape.

As a result, turbulence is reduced along the channel from the individual chamber 6 to the nozzle 4 via the nozzle communication channel 5 because of the through-hole 5b having a curved wall surface.

Thus, the present embodiment can reduce a disturbance of the liquid flow caused when the liquid flows to the discharge-side individual channel 56 that faces the nozzle communication channel 5.

Thus, the present embodiment can improve discharge stability.

Figure 17:
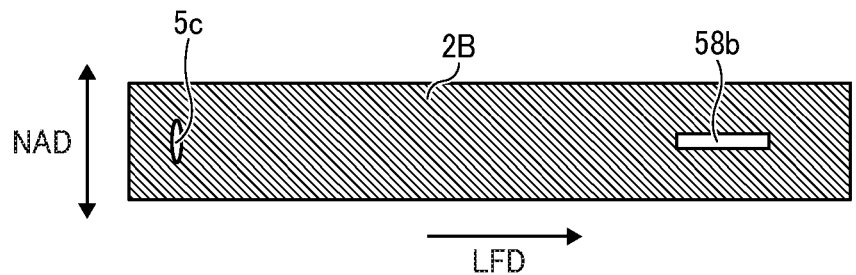
FIG. 17 is a plan view of a plate member forming a nozzle communication channel of the liquid discharge head according to a sixth embodiment of the present disclosure.

FIG. 17 illustrates the head 404 according to a sixth embodiment of the present disclosure.

FIG. 17 is a plan view of the plate member 2B that forms the nozzle communication channel 5.

The present embodiment includes an elliptical through-hole 5c formed in the plate member 2B. The plate member 2B constitutes the channel substrate 2.

The elliptical through-hole 5c is formed on a plane of the plate member 2B that forms the nozzle communication channel 5.

Further, a through-hole 58b is formed in the plate member 2B that constitutes a part of the discharge-side introduction portion 58. The through-hole 58b is a slot having a rectangular shape.

Thus, the present embodiment can arrange the nozzle communication channel 5 at one end in a longitudinal direction of the individual chamber 6 while securing a same opening cross-sectional area as in the fifth embodiment.

Thus, the present embodiment can shorten the length of the head 404 in the longitudinal direction.

Figure 18:
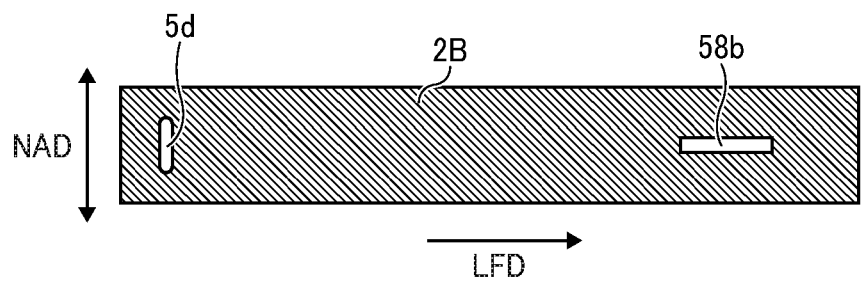
FIG. 18 is a plan view of a plate member forming a nozzle communication channel of the liquid discharge head according to a seventh embodiment of the present disclosure.

FIG. 18 illustrates the head 404 according to a seventh embodiment of the present disclosure.

FIG. 18 is a plan view of a plate member 2B forming the nozzle communication channel 5 in the seventh embodiment.

The plate member 2B of the present embodiment includes a through-hole 5d. The plate member 2B constitutes the channel substrate 2.

The through-hole 5d is a slot elongated in the nozzle array direction (NAD). Each ends of the through-hole 5d in a longitudinal direction of the through-hole 5d has an arcuate end. The through-hole 5d is formed in a plane that forms the nozzle communication channel 5.

Further, a through-hole 58b is formed in the plate member 2B that constitutes a part of the discharge-side introduction portion 58. The through-hole 58b is a slot having a rectangular shape.

Thus, the present embodiment can arrange the nozzle communication channel 5 at one end in a longitudinal direction of the individual chamber 6 while securing a same opening cross-sectional area as in the fifth embodiment.

Thus, the present embodiment can shorten the length of the head 404 in the longitudinal direction.

Figure 19:
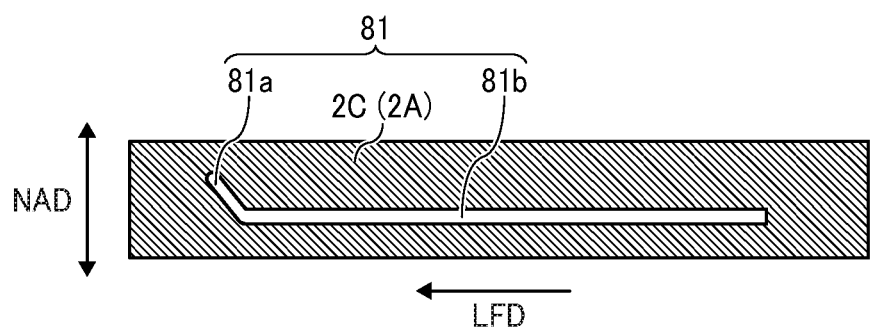
FIG. 19 is a plan view of a plate member forming a supply channel (or a discharge channel) of the liquid discharge head according to an eighth embodiment of the present disclosure.
Figure 20:
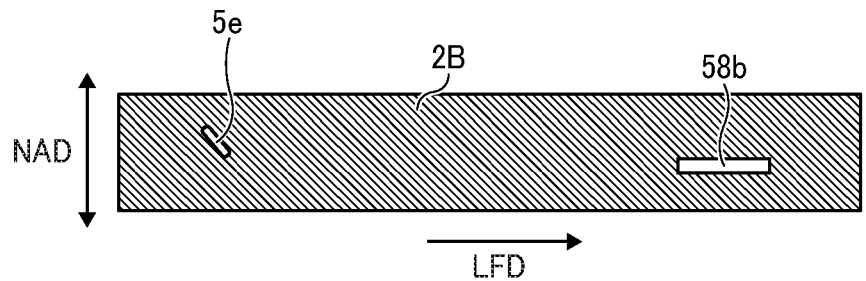
FIG. 20 is a plan view of the plate member that forms the nozzle communication channel.

FIGS. 19 and 20 illustrate the head 404 according to an eighth embodiment of the present disclosure.

FIG. 19 is a plan view of a plate member 2C forming the supply channel (or discharge channel) of the head 404.

FIG. 20 is a plan view of the plate member 2B that forms the nozzle communication channel 5.

The plate member 2C constituting the channel substrate 2 includes a continuous through-hole 81 that forms the supply channels including the supply-side introduction portion 8, the supply-side fluid restrictor 7, and the individual chamber 6.

The through-hole 81 includes a bent portion 81a and straight portion 81b. Here, the bent portion 81a is bent with respect to the straight portion 81b. The bent portion 81a corresponds to (facing with) the nozzle communication channel 5. The bent portion 81a is arranged on an upstream of the individual chamber 6 in a direction of liquid flow indicated by arrow LFD in FIG. 19.

The through-hole 5e forming the nozzle communication channel 5 is formed on the plate member 2B corresponding to the bent portion 81a of the through-hole 81.

Instead of the plate member 2C or together with the plate member 2A, the through-hole 81 of the plate member 2B forms a part of the nozzle communication channel 5, the discharge-side individual channel 56, and a part of the discharge-side introduction portion 58.

The present embodiment thus bends the supply-side channels (or the discharge-side channels) to further reduce the size of the head 404.

Further, the preset embodiment can form the nozzle communication channel 5, the discharge-side individual channel 56, and the discharge-side introduction portion 58 even when pitch between nozzles and the piezoelectric actuators is shifted.

Figure 21:
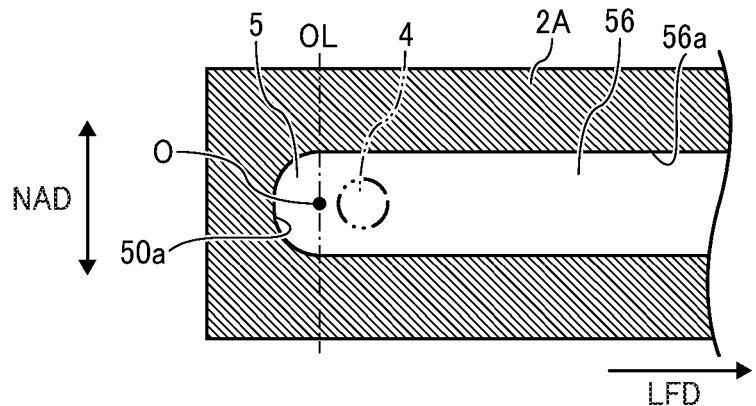
FIG. 21 is a plan view of a plate member forming a discharge channel of the liquid discharge head according to a ninth embodiment of the present disclosure.
Figure 22:
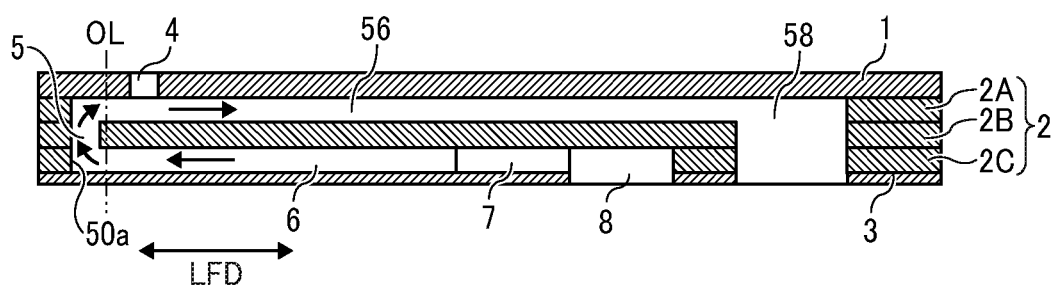
FIG. 22 is a cross-sectional view of a main part of the liquid discharge head along the direction perpendicular to the nozzle array direction (NAD).

FIGS. 21 and 22 illustrate the head 404 according to a ninth embodiment of the present disclosure.

FIG. 21 is a plan view of plate member 2A that forms the discharge channels in the head 404.

FIG. 22 is a cross-sectional view of a main portion of the head 404 along the direction perpendicular to a nozzle array direction (NAD).

Similar to the fifth embodiment, the present embodiment includes the nozzle communication channel 5 including a wall surface 50a having an arc in plan view. The nozzle communication channel 5 faces an inlet of the discharge-side individual channel 56 that becomes an inlet of the discharge channels.

Further, the present embodiment includes the nozzle 4 arranged on the opposite side of the wall surface 50a with respect to a center O of the arc in the direction perpendicular to the nozzle array direction (NAD). In other words, the nozzle 4 is arranged farther than the center O of the arc from the wall surface 50a. The direction perpendicular to the nozzle array direction (NAD) is a direction along liquid flow indicated by LFD in FIG. 21.

Figure 23:
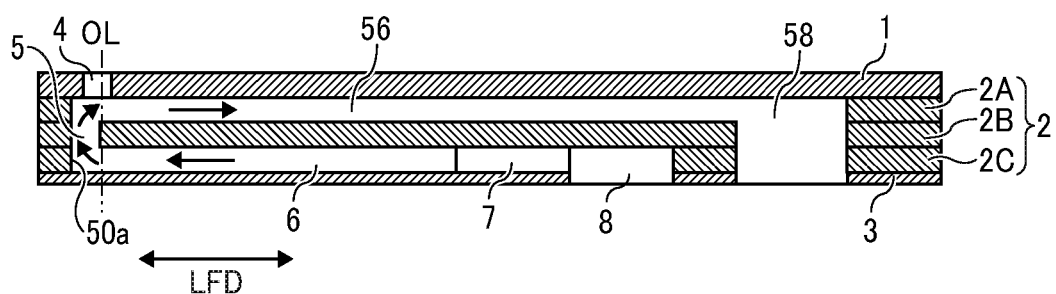
FIG. 23 is a cross-sectional view of a main part of the liquid discharge head of a comparative example along the direction perpendicular to the nozzle array direction (NAD)

A line passing through the center O is indicated by "OL" in FIGS. 21 through 23. In FIG. 21, the line OL is along the nozzle array direction NAD.

As a result, as illustrated in FIG. 22, when liquid flows from the individual chamber 6 to the nozzle communication channel 5 as indicated by an arrow, the liquid flows to go around to the nozzle 4 side after the direction of the liquid flow is bent toward the discharge-side individual channel 56 by the wall surface 50a.

Therefore, the present embodiment can refresh the liquid in the nozzle 4 while enabling the head 404 to stably discharge the liquid.

Conversely, the comparative example illustrated in FIG. 23 includes the nozzle 4 arranged closer to the wall surface 50a than the center O of the arc of the wall surface 50a in the direction perpendicular to the nozzle array direction (NAD).

The liquid flows into the discharge-side individual channel 56 around the nozzle 4 before the direction of the liquid flow is bent by the wall surface 50a. Thus, the liquid does not stably flow that affects the discharge characteristics of the head 404.

Figure 24:
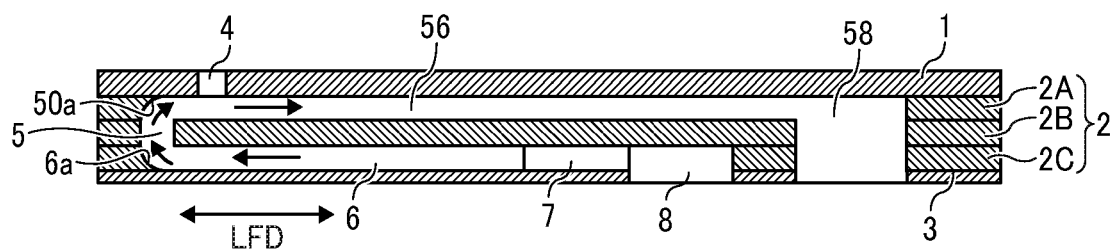
FIG. 24 is a cross-sectional view of a main part of the liquid discharge head along the direction perpendicular to the nozzle array direction (NAD) according to a tenth embodiment.

FIG. 24 illustrates the head 404 according to a tenth embodiment of the present disclosure.

FIG. 24 is a cross-sectional view of the head 404 along the direction perpendicular to a nozzle array direction (NAD).

In the present embodiment, an end portion 6a of the individual chamber 6 at the nozzle communication channel 5 side (left end side in FIG. 24) has a curved shape inclined in an upper left direction toward a downstream of the nozzle communication channel 5 in the liquid flow direction (LFD).

Further, the wall surface 50a of the nozzle communication channel 5 facing the discharge-side individual channel 56 has a curved shape inclined in an upper right direction toward the entrance of the discharge-side individual channel 56.

As a result, the liquid flows more stably, and discharge characteristics of the head 404 are stabilized.

Figure 25:
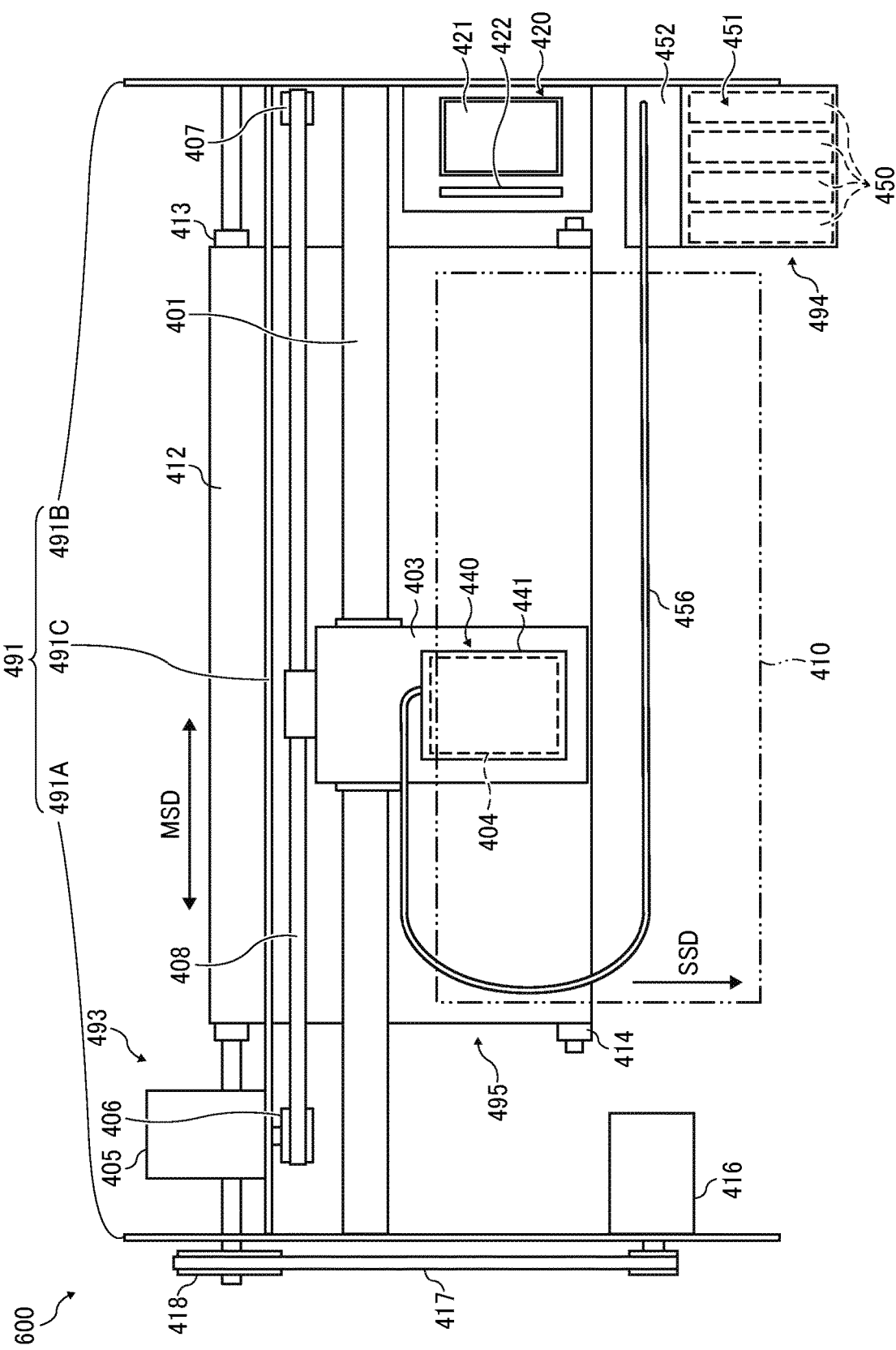
FIG. 25 is a plan view of a portion of a liquid discharge apparatus according to embodiments of the present disclosure.
Figure 26:
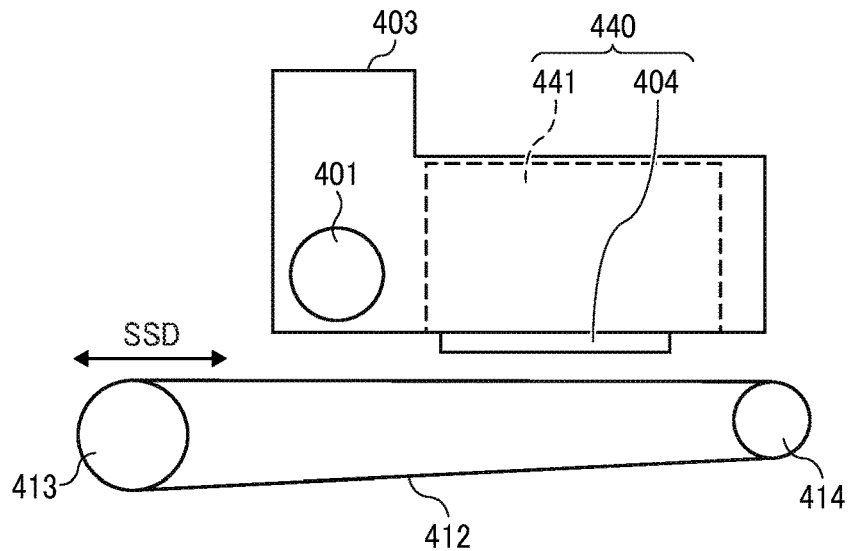
FIG. 26 is a side view of a portion of the liquid discharge apparatus.

FIGS. 25 and 26 illustrate an example of a liquid discharge apparatus 600 according to the present embodiment.

FIG. 25 is a plan view of a main part of the liquid discharge apparatus 600.

FIG. 26 is a side view of a portion of the liquid discharge apparatus 600.

The liquid discharge apparatus 600 is a serial-type apparatus in which a main scan drive unit 493 reciprocally moves a carriage 403 in a main scanning direction (MSD) indicated by an arrow in FIG. 25.

The main scan drive unit 493 includes a guide 401, a main scanning motor 405, a timing belt 408, etc.

The guide 401 extends between a left side plate 491A and a right side plate 491B, and supports the carriage 403 so that the carriage 403 is movable along the guide 401.

The main scanning motor 405 reciprocally moves the carriage 403 in the main scanning direction MSD via the timing belt 408 laterally bridged between a drive pulley 406 and a driven pulley 407.

The carriage 403 mounts a liquid discharge device 440 in which the head 404 according to the present embodiment and a head tank 441 are integrated as a single unit.

The head 404 of the liquid discharging device 440 discharges color liquids of, for example, yellow (Y), cyan (C), magenta (M), and black (K).

The head 404 includes nozzle rows each including a plurality of nozzles 4 arrayed in a sub-scanning direction (SSD). The sub-scanning direction (SSD) is along the nozzle array direction (NAD). The sub-scanning direction (SSD) is perpendicular to the main scanning direction (MSD). The head 404 is mounted to the carriage 403 so that ink droplets are discharged downward.

The liquid stored outside the head 404 is supplied to the head 404 via a supply unit 494 that supplies the liquid from liquid cartridges 450 to the head tank 441.

The supply unit 494 includes. e.g., a cartridge holder 451 as a mount part to mount a liquid cartridge 450, a tube 456, and a liquid feed unit 452 including a liquid feed pump.

The liquid cartridge 450 is detachably attached to the cartridge holder 451.

The liquid is supplied to the head tank 441 by the liquid feed unit 452 via the tube 456 from the liquid cartridge 450.

The liquid discharge apparatus 600 includes a conveyor 495 to convey a sheet 410.

The conveyor 495 includes a conveyance belt 412 as a conveyor and a sub-scanning motor 416 to drive the conveyance belt 412.

The conveyance belt 412 attracts the sheet 410 and conveys the sheet 410 at a position facing the head 404.

The conveyance belt 412 is in a form of an endless belt. The conveyance belt 412 is stretched between a conveyance roller 413 and a tension roller 414.

The sheet 410 is attracted to the conveyance belt 412 by electrostatic force or air suction.

The conveyance roller 413 is rotated by a sub-scanning motor 416 via a timing belt 417 and a timing pulley 418, so that the conveyance belt 412 circulates in the sub-scanning direction (SSD) in FIG. 25.

At one side in the main scanning direction (MSD) of the carriage 403, a maintenance unit 420 to recover the head 404 in good condition is disposed on a lateral side (right-hand side) of the conveyance belt 412 in FIG. 25.

The maintenance unit 420 includes, for example, a cap 421 to contact and cap the nozzle surface 1a of the head 404 illustrated in FIG. 2 and a wiper 422 to wipe the nozzle surface 1a. The nozzle surface 1a is a surface of the nozzle plate 1 in which the nozzles 4 are formed.

The main scan drive unit 493, the supply unit 494, the maintenance unit 420, and the conveyor 495 are mounted to a housing 491 that includes the left side plate 491A, the right side plate 491B, and a rear side plate 491C.

In the liquid discharge apparatus 600 thus configured, a sheet 410 is conveyed on and attracted to the conveyance belt 412 and is conveyed in the sub-scanning direction SSD by the cyclic rotation of the conveyance belt 412.

The head 404 is driven in response to image signals while the carriage 403 moves in the main scanning direction MSD, to discharge liquid to the sheet 410 stopped, thus forming an image on the sheet 410.

As described above, the liquid discharge apparatus 600 includes the head 404 according to the present embodiment, thus allowing stable formation of high quality images.

Figure 27:
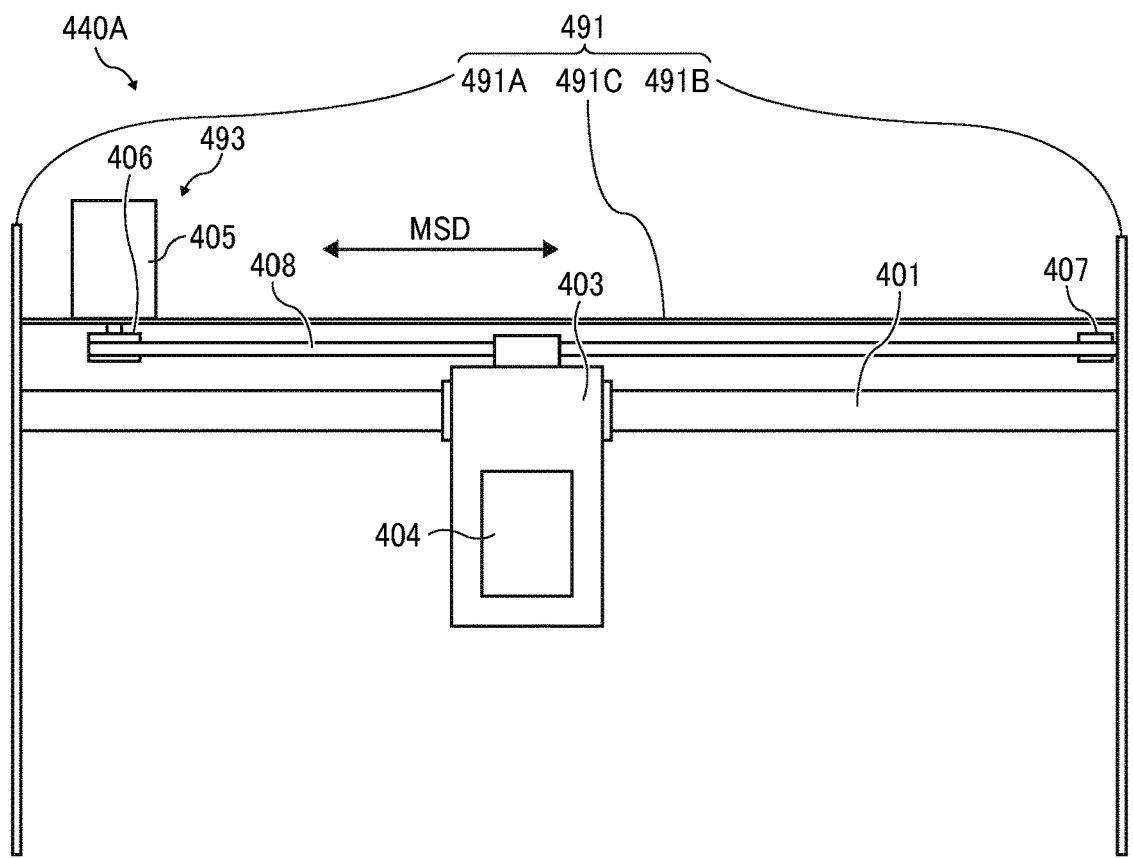
FIG. 27 is a plan view of an example of a portion of a liquid discharge device.

FIG. 27 illustrates another example of the liquid discharge device 440A according to another embodiment of the present disclosure.

FIG. 27 is a plan view of a main part of the liquid discharge device 440A.

The liquid discharge device 440A includes the housing 491, the main scan drive unit 493, the carriage 403, and the head 404 among components of the liquid discharge apparatus 600. The left side plate 491A, the right side plate 491B, and the rear side plate 491C constitute the housing 491.

Note that, in the liquid discharge device 440A, at least one of the maintenance unit 420 and the supply unit 494 described above may be mounted on, for example, the right side plate 491B.

Figure 28:
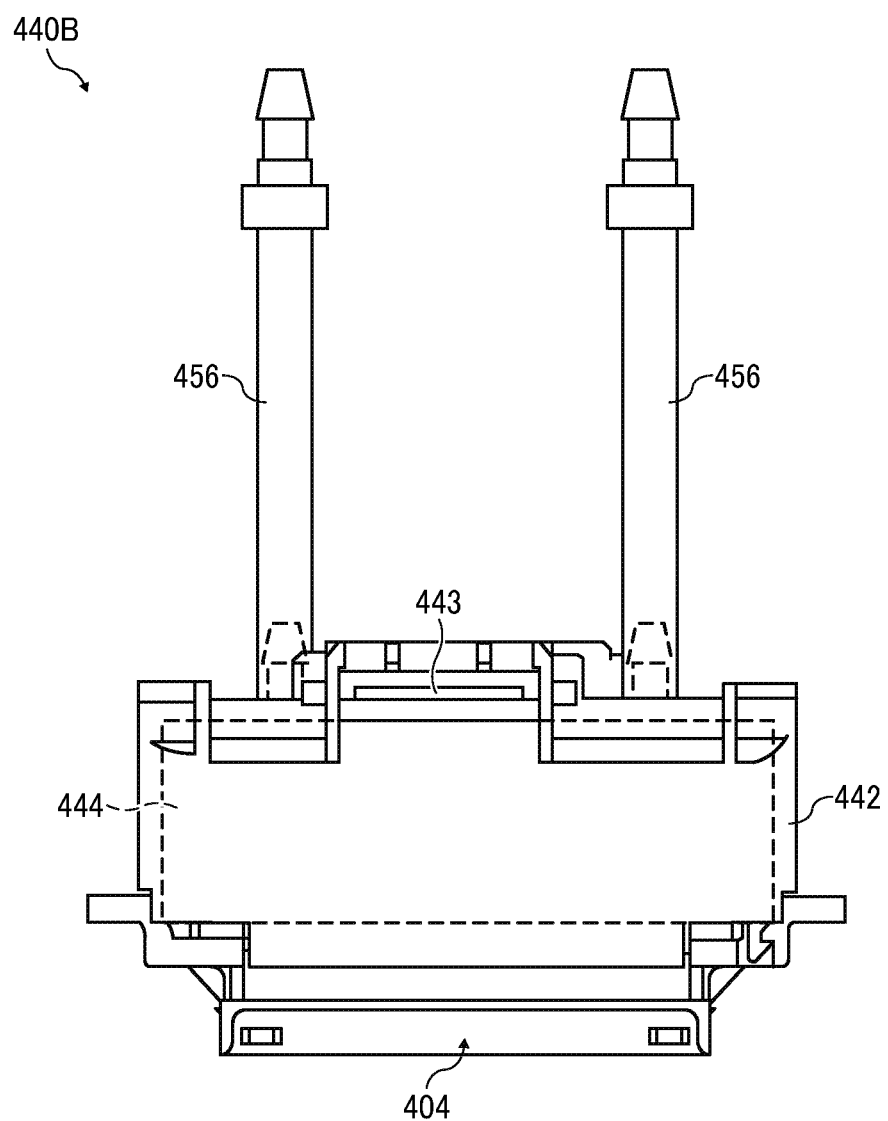
FIG. 28 is a front view of another example of the liquid discharge device.

FIG. 28 illustrates still another example of the liquid discharge device 440B according to embodiments of the present disclosure.

FIG. 28 is a front view of the liquid discharge device 440B.

The liquid discharge device 440B includes the head 404 to which a channel part 444 is mounted and a tube 456 connected to the channel part 444.

Further, the channel part 444 is disposed inside a cover 442.

Instead of the channel part 444, the liquid discharge device 440B may include the head tank 441.

A connector 443 to electrically connect the head 404 to a power source is disposed above the channel part 444.

Figure 29:
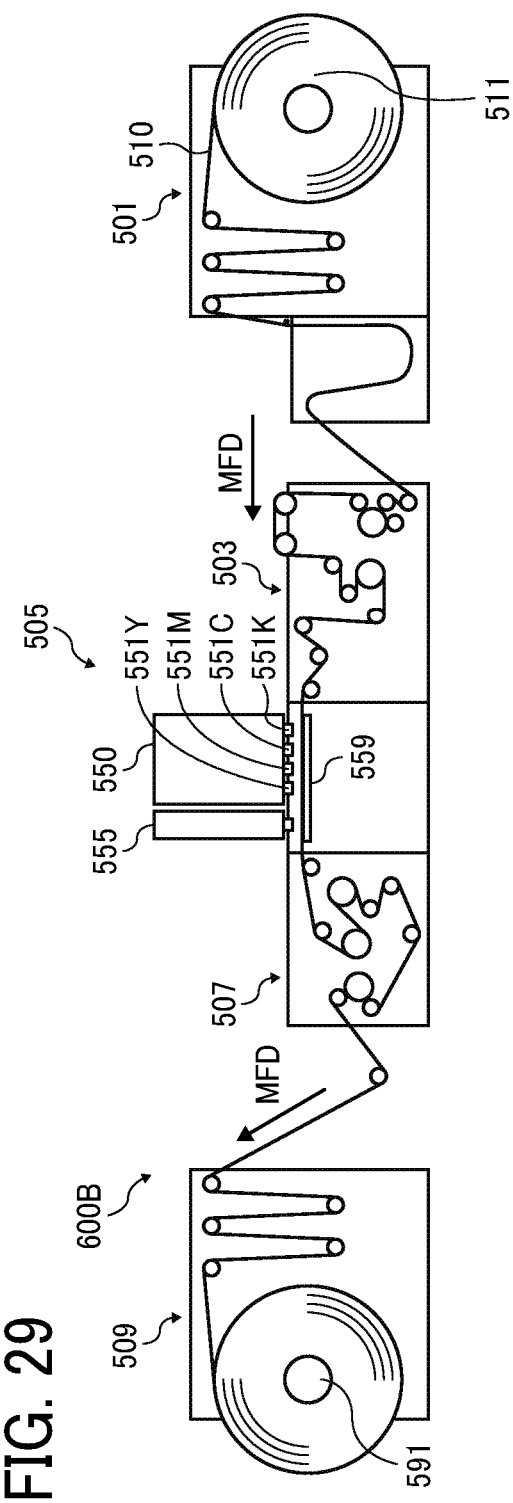
FIG. 29 is a front view a liquid discharge apparatus according to still another embodiment of the present disclosure.

FIGS. 29 and 30 illustrate an example of a liquid discharge apparatus 600B according to the present embodiment.

FIG. 29 is a schematic front view of the liquid discharge apparatus 600B.

FIG. 30 is a plan view of a head unit 550 of the liquid discharge apparatus 600B of FIG. 29.

The liquid discharge apparatus 600B according to the present embodiment includes a feeder 501 to feed a medium 510, a guide conveyor 503 to guide and convey the medium 510, fed from the feeder 501, to a printing unit 505, the printing unit 505 to discharge liquid onto the medium 510 to form an image on the medium 510, a drier unit 507 to dry the medium 510, and an ejector 509 to eject the medium 510. The medium 510 is a continuous medium such as a rolled sheet.

The medium 510 is fed from a winding roller 511 of the feeder 501, guided and conveyed with rollers of the feeder 501, the guide conveyor 503, the drier unit 507, and the ejector 509, and wound around a take-up roller 591 of the ejector 509.

In the printing unit 505, the medium 510 is conveyed opposite a first head unit 550 and a second head unit 555 on a conveyance guide 559. The first head unit 550 discharges liquid to form an image on the medium 510. Post-treatment is performed on the medium 510 with treatment liquid discharged from the second head unit 555.

Here, the first head unit 550 includes, for example, four-color full-line head arrays 551K, 551C, 551M, and 551Y (hereinafter, collectively referred to as "head arrays 551" unless colors are distinguished) from an upstream side in a feed direction of the medium 510 (hereinafter, "medium feed direction") indicated by arrow MFD in FIG. 29.

The head arrays 551K, 551C, 551M, and 551Y are liquid dischargers to discharge liquid of black (K), cyan (C), magenta (M), and yellow (Y) onto the medium 510.

Note that the number and types of color are not limited to the above-described four colors of K, C, M, and Y and may be any other suitable number and types.

In each head array 551, for example, as illustrated in FIG. 30, the heads 404 are staggered on abase 552 to form the head array 551. Note that the configuration of the head array 551 is not limited to such a configuration.

Next, an example of a liquid circulation system according to embodiments of the present disclosure is described with reference to FIG. 31.

Figure 31:
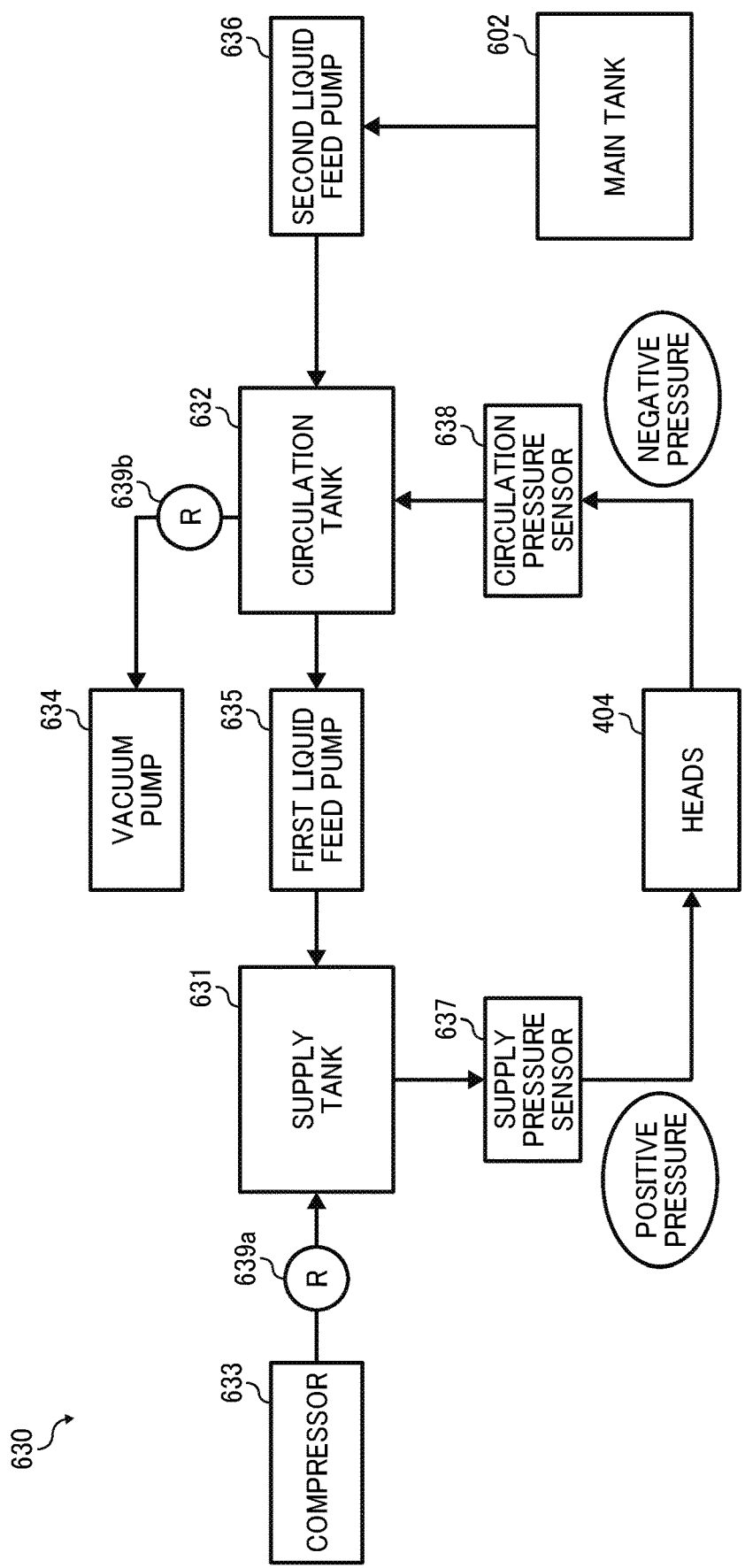
FIG. 31 is a block diagram of a liquid circulation system of the liquid discharge apparatus of FIG. 30.

FIG. 31 is a block diagram of the liquid circulation system according to embodiments of the present disclosure.

As illustrated in FIG. 31, the liquid circulation system 630 includes a main tank 602, the heads 404, a supply tank 631, a circulation tank 632, a compressor 633, a vacuum pump 634, a first liquid feed pump 635, a second liquid feed pump 636, a supply pressure sensor 637, a circulation pressure sensor 638, and a regulator (R) 639*a* and 639*b*.

The supply pressure sensor 637 is disposed between the supply tank 631 and the heads 404 and connected to a supply channel connected to the supply ports 41 (see FIG. 1) of the heads 404.

The circulation pressure sensor 638 is disposed between the circulation tank 632 and the heads 404 and connected to a discharge channel connected to the discharge ports 42 (see FIG. 1) of the heads 404.

One end of the circulation tank 632 is connected with the supply tank 631 via the first liquid feed pump 635 and the other end of the circulation tank 632 is connected with the main tank 602 via the second liquid feed pump 636.

Thus, the liquid is flown from the supply tank 631 into the heads 404 through the supply ports 41 and discharged from the discharge ports 42 to the circulation tank 632.

Further, the first liquid feed pump 635 feeds liquid from the circulation tank 632 to the supply tank 631, thus circulating liquid.

The supply tank 631 is connected to the compressor 633 and controlled so that a predetermined positive pressure is detected with the supply pressure sensor 637.

The circulation tank 632 is connected to the vacuum pump 634 and controlled so that a predetermined negative pressure is detected with the circulation pressure sensor 638.

Such a configuration allows the menisci of ink in the nozzles 4 of the heads 404 to be maintained at a constant negative pressure while circulating ink through the inside of the heads 404.

When the liquid is discharged from the nozzles 4 of the heads 404, the amount of liquid in each of the supply tank 631 and the circulation tank 632 decreases.

Hence, the second liquid feed pump 636 properly replenishes liquid from the main tank 602 to the circulation tank 632.

A timing of replenishing the liquid from the main tank 602 to the circulation tank 632 is controlled in accordance with a result of detection with, e.g., a liquid level sensor in the circulation tank 632, for example, in a manner in which liquid is replenished when the liquid level of liquid in the circulation tank 632 is lower than a predetermined height.

In the present disclosure, discharged liquid is not limited to a particular liquid as long as the liquid has a viscosity or surface tension to be discharged from the head 404. However, preferably, the viscosity of the liquid is not greater than 30 mPa s under ordinary temperature and ordinary pressure or by heating or cooling.

Examples of the liquid include a solution, a suspension, or an emulsion including, for example, a solvent, such as water or an organic solvent, a colorant, such as dye or pigment, a functional material, such as a polymerizable compound, a resin, or a surfactant, a biocompatible material, such as DNA, amino acid, protein, or calcium, and an edible material, such as a natural colorant.

Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication.

Examples of an energy source for generating energy to discharge liquid include a piezoelectric actuator (a laminated piezoelectric element or a thin-film piezoelectric element), a thermal actuator that employs a thermoelectric conversion element, such as a heating resistor (element), and an electrostatic actuator including a diaphragm and opposed electrodes.

The "liquid discharge device" is an integrated unit including the head and a functional part(s) or unit(s), and is an assembly of parts relating to liquid discharge.

For example, "the liquid discharge device" may be a combination of the head with at least one of a head tank, a carriage, a supply unit, a maintenance unit, and a main scan drive unit.

Herein, the terms "integrated" or "united" mean fixing the head and the functional parts (or mechanism) to each other by fastening, screwing, binding, or engaging and holding one of the head and the functional parts movably relative to the other.

The head may be detachably attached to the functional part(s) or unit(s) each other.

For example, the head and a head tank are integrated as the liquid discharge device.

The head and the head tank may be connected each other via, e.g., a tube to integrally form the liquid discharge device.

Here, a unit including a filter may further be added to a portion between the head tank and the head of the liquid discharge device.

The liquid discharge device may be an integrated unit in which a head is integrated with a carriage.

The liquid discharge device may be the head movably held by a guide that forms part of a main scan dive unit, so that the head and the main scan drive unit are integrated as a single unit.

The liquid discharge device may include the head, the carriage, and the main scan drive unit that are integrated as a single unit.

In another example, the cap that forms part of the maintenance unit is secured to the carriage mounting the head so that the head, the carriage, and the maintenance unit are integrated as a single unit to form the liquid discharge device.

Further, the liquid discharge device may include tubes connected to the head mounted on the head tank or the channel member so that the head and the supply unit are integrated as a single unit.

The Liquid is supplied from a liquid reservoir source such as liquid cartridge to the head through the tube.

The main scan drive unit may be a guide only.

The supply unit may be a tube(s) only or a mounting part (loading unit) only.

The term "liquid discharge apparatus" used herein also represents an apparatus including the head or the liquid discharge device to discharge liquid by driving the head.

The liquid discharge apparatus may be, for example, an apparatus capable of discharging liquid onto a material to which liquid can adhere or an apparatus to discharge liquid into gas or another liquid.

The "liquid discharge apparatus" may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, on which the liquid has been discharged.

The "liquid discharge apparatus" may be, for example, an image forming apparatus to form an image on a sheet by discharging ink, or a three-dimensional fabricating apparatus to discharge a fabrication liquid to a powder layer in which powder material is formed in layers, so as to form a three-dimensional fabrication object.

In addition, "the liquid discharge apparatus" is not limited to such an apparatus to form and visualize meaningful images, such as letters or figures, with discharged liquid.

For example, the liquid discharge apparatus may be an apparatus to form meaningless images, such as meaningless patterns, or fabricate three-dimensional images.

The above-described term "material on which liquid can be adhered" represents a material on which liquid is at least temporarily adhered, a material on which liquid is adhered and fixed, or a material into which liquid is adhered to permeate.

Examples of the "medium on which liquid can be adhered" include recording media, such as paper sheet, recording paper, recording sheet of paper, film, and cloth, electronic component, such as electronic substrate and piezoelectric element, and media, such as powder layer, organ model, and testing cell. The "medium on which liquid can be adhered" includes any medium on which liquid is adhered, unless particularly limited.

Examples of "the material on which liquid can be adhered" include any materials on which liquid can be adhered even temporarily, such as paper, thread, fiber, fabric, leather, metal, plastic, glass, wood, and ceramic.

"The liquid discharge apparatus" may be an apparatus to relatively move a head and a medium on which liquid can be adhered. However, the liquid discharge apparatus is not limited to such an apparatus.

For example, the liquid discharge apparatus may be a serial head apparatus that moves the head or a line head apparatus that does not move the head.

Examples of the "liquid discharge apparatus" further include a treatment liquid coating apparatus to discharge a treatment liquid to a sheet surface to coat the sheet surface with the treatment liquid to reform the sheet surface and an injection granulation apparatus to discharge a composition liquid including a raw material dispersed in a solution from a nozzle to mold particles of the raw material.

The terms "image formation", "recording", "printing", "image printing", and "fabricating" used herein may be used synonymously with each other.

Numerous additional modifications and variations are possible in light of the above teachings. It is therefore to be understood that, within the scope of the above teachings, the present disclosure may be practiced otherwise than as specifically described herein. With some embodiments having thus been described, it is obvious that the same may be varied in many ways. Such variations are not to be regarded as a departure from the scope of the present disclosure and appended claims, and all such modifications are intended to be included within the scope of the present disclosure and appended claims.

What is claimed is:

1. A liquid discharge head; comprising:
    a nozzle to discharge a liquid in a nozzle discharge direction in which the liquid flows out of the nozzle;
    a nozzle communication channel communicating with the nozzle;
    an individual chamber communicating with the nozzle communication channel;
    a supply channel communicating with the individual chamber to supply the liquid to the individual chamber;
    a supply-side common chamber communicating with the supply channel;
    a discharge channel communicating with the nozzle communication channel to discharge the liquid in the individual chamber and the nozzle communication channel and extending downstream from the nozzle in a direction of flow of the liquid; and
    a discharge-side common chamber communicating with the discharge channel, wherein a total fluid resistance from the supply-side common chamber to the nozzle communication channel, including the supply-side common chamber, the supply channel, and the nozzle communication channel, is greater than a fluid resistance from the discharge channel to the discharge-side common chamber, including the discharge channel and the discharge-side common chamber.

2. The liquid discharge head according to claim 1, wherein an entrance of the discharge channel faces a wall surface of the nozzle communication channel.

3. The liquid discharge head according to claim 2, wherein the supply channel has a supply-side fluid restrictor, and the discharge channel has a discharge-side fluid restrictor.

4. The liquid discharge head according to claim 1, wherein a fluid resistance of the supply channel Rin, the fluid resistance of the discharge channel Rout, and a fluid resistance Rp of the nozzle satisfy a relation Rin>Rout>Rp.

5. The liquid discharge head according to claim 2, wherein a wall surface of the nozzle communication channel facing an entrance of the discharge channel has a curved surface.

6. The liquid discharge head according to claim 1, wherein the supply channel and the discharge channel overlap in a direction parallel to the nozzle discharge direction.

7. A liquid discharge device comprising the liquid discharge head according to claim 1.

8. The liquid discharge device according to claim 7, further comprising at least one of:
a head tank to store the liquid to be supplied to the liquid discharge head;
a carriage to mount the liquid discharge head;
a supply unit to supply the liquid to the liquid discharge head;
a maintenance unit to maintain the liquid discharge head; and
a drive unit to move the carriage in a main scanning direction, and integrated with the liquid discharge head as a single unit.

9. A liquid discharge apparatus comprising the liquid discharge device according to claim 7.

10. A liquid discharge head, comprising:
a nozzle to discharge a liquid in a nozzle discharge direction in which the liquid flows out of the nozzle;
a nozzle communication channel communicating with the nozzle;
an individual chamber communicating with the nozzle communication channel;
a supply channel communicating with the individual chamber to supply the liquid to the individual chamber;
a supply-side common chamber communicating with the supply channel;
a supply port communicating with the supply-side common chamber to supply the liquid to the supply-side common chamber;
a discharge channel communicating with the nozzle communication channel;
a discharge-side common chamber communicating with the discharge channel; and
a discharge port communicating with the discharge-side common chamber to discharge the liquid outside the liquid discharge head from the discharge-side common chamber,
wherein a total fluid resistance from the supply port to the nozzle communication channel, including the supply-side common chamber, the supply channel, the individual chamber, and the nozzle communication channel, is greater than a total fluid resistance from the discharge channel to the discharge port, including the discharge channel and the discharge-side common chamber.

11. The liquid discharge head according to claim 10, wherein an entrance of the discharge channel faces a wall surface of the nozzle communication channel.

12. The liquid discharge head according to claim 11, wherein the supply channel has a supply-side fluid restrictor, and the discharge channel has a discharge-side fluid restrictor.

13. The liquid discharge head according to claim 10, wherein the fluid resistance of the supply channel Rin, the fluid resistance of the discharge channel Rout, and a fluid resistance Rp of the nozzle satisfy a relation Rin>Rout>Rp.

14. The liquid discharge head according to claim 11, wherein a wall surface of the nozzle communication channel facing an entrance of the discharge channel has a curved surface.

15. The liquid discharge head according to claim 10, wherein the supply channel and the discharge channel overlap in a direction parallel to the nozzle discharge direction.

16. A liquid discharge device comprising the liquid discharge head according to claim 10.

17. The liquid discharge device according to claim 16, further comprising at least one of:
a head tank to store the liquid to be supplied to the liquid discharge head;
a carriage to mount the liquid discharge head;
a supply unit to supply the liquid to the liquid discharge head;
a maintenance unit to maintain the liquid discharge head; and
a drive unit to move the carriage in a main scanning direction, and integrated with the liquid discharge head as a single unit.

18. A liquid discharge apparatus comprising the liquid discharge device according to claim 16.

19. A liquid discharge head, comprising:
a nozzle to discharge a liquid in a nozzle discharge direction in which the liquid flows out of the nozzle;
a nozzle communication channel communicating with the nozzle;
an individual chamber communicating with the nozzle communication channel;
a first communicating channel communicating with the individual chamber to supply the liquid to the individual chamber; and
second communicating channel communicating with the nozzle communication channel to discharge the liquid in the individual chamber and the nozzle communication channel,
wherein the first communication channel includes a supply-side fluid restrictor having a cross-sectional area smaller than the individual chamber,
the second communication channel includes a discharge-side fluid restrictor having a cross-sectional area smaller than the nozzle communication channel, and
a total fluid resistance of the first communication channel Rin, including the supply-side fluid restrictor, the individual chamber, and the nozzle commination channel, and a total fluid resistance of the second communication channel Rout, including the discharge-side fluid restrictor, satisfy a relation Rin>Rout.

20. The liquid discharge head according to claim 19, wherein the nozzle communication channel is between the individual chamber and the nozzle in the nozzle discharge direction.

21. The liquid discharge head of claim 1, further comprising a nozzle plate that defines a wall of the discharge channel.

* * * * *